US009137336B1

(12) United States Patent
Zalunin

(10) Patent No.: US 9,137,336 B1
(45) Date of Patent: Sep. 15, 2015

(54) DATA COMPRESSION TECHNIQUES

(75) Inventor: Vasily Olegovich Zalunin, Saint-Petersburg (RU)

(73) Assignee: EMC Corporation, Hopkinton, MA (US)

( * ) Notice: Subject to any disclaimer, the term of this patent is extended or adjusted under 35 U.S.C. 154(b) by 580 days.

(21) Appl. No.: 13/135,266

(22) Filed: Jun. 30, 2011

(51) Int. Cl.
*G06F 3/00* (2006.01)
*G06F 13/12* (2006.01)
*H03M 7/00* (2006.01)
*H03M 7/34* (2006.01)
*H03M 7/46* (2006.01)
*H03M 1/36* (2006.01)
*G06F 13/00* (2006.01)
*G11B 20/14* (2006.01)
*H04L 29/06* (2006.01)
*H03M 7/30* (2006.01)

(52) U.S. Cl.
CPC ............... *H04L 69/04* (2013.01); *H03M 7/30* (2013.01)

(58) Field of Classification Search
CPC .. H03M 7/30; G06F 2212/401; G06F 3/0601; G06F 3/0608
USPC .............. 710/68; 341/50; 379/386; 707/5; 711/171; 369/59.24
See application file for complete search history.

(56) References Cited

U.S. PATENT DOCUMENTS

| | | | | |
|---|---|---|---|---|
| 5,627,995 A | * | 5/1997 | Miller et al. | 711/171 |
| 5,760,717 A | * | 6/1998 | Scholz | 341/59 |
| 5,819,058 A | * | 10/1998 | Miller et al. | 712/210 |
| 7,609,182 B2 | * | 10/2009 | Owsley et al. | 341/65 |
| 7,669,108 B2 | * | 2/2010 | Kikuchi et al. | 714/775 |
| 2002/0110071 A1 | * | 8/2002 | Oki et al. | 369/59.24 |
| 2006/0017591 A1 | * | 1/2006 | Bossen | 341/50 |
| 2008/0001790 A1 | * | 1/2008 | Kirby et al. | 341/50 |
| 2009/0063465 A1 | * | 3/2009 | Ferragina et al. | 707/5 |
| 2009/0154690 A1 | * | 6/2009 | Wu | 379/386 |
| 2012/0081242 A1 | * | 4/2012 | He et al. | 341/107 |

OTHER PUBLICATIONS http://encode.ru/threads/1208-CUDA-GPU-based-BWT-ST4-sorting/page1, Jan. 2011.
en.wikipedia.org, Burrows Wheeler Transform, Apr. 2011.
"A Block-sorting Lossless Data Compression Algorithm", Burrows et al., Digital Equipment Corporation, SRC Research Report, Technical Report 124, May 10, 1994.
D.A. Huffman, "A Method for the Construction of Minimum-Redundancy Codes", Proceedings of the I.R.E., Sep. 1952, pp. 1098-1102, which is incorporated by reference herein).
M. Schindler, "A fast block-sorting algorithm for lossless data compression," in Proceedings DCC '97 Data Compression Conference, Snowbird, UT, USA, Mar. 1997.
Ryabko, B. Ya. Data compression by means of a "book stack", Problems of Information Transmission, 1980, v. 16: (4), pp. 265-269.

* cited by examiner

*Primary Examiner* — Farley Abad
*Assistant Examiner* — Henry Yu
(74) *Attorney, Agent, or Firm* — Muirhead and Saturnell, LLC

(57) ABSTRACT

Described are techniques for performing data compression. Input data is received. A plurality of stop symbols is inserted at predetermined positions between portions of said input data. A block sorting transform on said input data is performed that generates a first intermediate output. The block sorting transform is performed by executing code on a graphic processing unit that processes portions of said input data in parallel. Subsequent processing of the intermediate output is performed to generate compressed data.

18 Claims, 17 Drawing Sheets

BNN^AA@A — 602

| Add 1 | Sort 1 | Add 2 | Sort 2 |
|---|---|---|---|
| B | A | BA | AN |
| N | A | NA | AN |
| N | A | NA | A@ |
| ^ | B | ^B | BA |
| A | N | AN | NA |
| A | N | AN | NA |
| @ | ^ | @^ | ^B |
| A | @ | A@ | @^ |

| Add 3 | Sort 3 | Add 4 | Sort 4 |
|---|---|---|---|
| BAN | ANA | BANA | ANAN |
| NAN | ANA | NANA | ANA@ |
| NA@ | A@^ | NA@^ | A@^B |
| ^BA | BAN | ^BAN | BANA |
| ANA | NAN | ANAN | NANA |
| ANA | NA@ | ANA@ | NA@^ |
| @^B | ^BA | @^BA | ^BAN |
| A@^ | @^B | A@^B | @^BA |

| Add 5 | Sort 5 | Add 6 | Sort 6 |
|---|---|---|---|
| BANAN | ANANA | BANANA | ANANA@ |
| NANA@ | ANA@^ | NANA@^ | ANA@^B |
| NA@^B | A@^BA | NA@^BA | A@^BAN |
| ^BANA | BANAN | ^BANAN | BANANA |
| ANANA | NANA@ | ANANA@ | NANA@^ |
| ANA@^ | NA@^B | ANA@^B | NA@^BA |
| @^BAN | ^BANA | @^BANA | ^BANAN |
| A@^BA | @^BAN | A@^BAN | @^BANA |

DATA COMPRESSION TECHNIQUES

BACKGROUND

This application generally relates to techniques that may be used in connection with data compression.

Data compression may be characterized as the process of encoding source information using an encoding scheme into a compressed form having fewer bits than the original or source information. Different encoding schemes may be used in connection with data compression. One class of data compression techniques is generally known as lossless data compression techniques allowing the exact original information to be reconstructed from the compressed form. Such techniques of the first class may be used when it is important that the original and decompressed forms remain bitwise identical. Another class of data compression techniques is generally known as lossy data compression techniques in which there is some acceptable loss or difference between the original and decompressed forms. Lossy compression techniques may utilize quality information indicating which portions of the source information are more or less important in comparison to other portions of the source information. The lossy compression techniques may disregard the less important information while still retaining the other more important information.

In a compression system, an encoder may be used in producing a compressed form of the original or source information. The compressed form may subsequently be processed by a decoder to form a decompressed reconstruction of the original information. In connection with performing compression, one technique that may be used is the Burrows-Wheeler transform (BWT, also referred to as block-sorting compression), as developed by Michael Burrows and David Wheeler. For data compression, the BWT algorithm may be used in combination with one or more other techniques to compress input data.

SUMMARY OF THE INVENTION

In accordance with one aspect of the invention is a method for performing data compression comprising: receiving input data; inserting a plurality of stop symbols at predetermined positions between portions of said input data; performing a block sorting transform on said input data generating a first intermediate output wherein said block sorting transform is performed by executing code on a graphic processing unit that processes portions of said input data in parallel; and performing subsequent processing of said intermediate output to generate compressed data. The subsequent processing may include performing a move to front transform using said first intermediate output and generating a second intermediate output. The second intermediate output may be input to entropy encoding which generates said compressed data. The block sorting transform may be a version of a Burrows-Wheeler transform. The method may include inserting a stop symbol between each predetermined number of symbols of the input data prior to performing said block sorting transform. The stop symbol may not be unique with respect to symbols of the input data, said stop symbol being a symbol that is included in said input data. The stop symbol may be unique with respect to symbols of the input data, said stop symbol being a symbol that is not included in said input data. The method may include inserting said stop symbol as a new additional symbol into a stream of the input data being processed. A first portion of said input data may be processed that includes M symbols, each symbol in said input data being represented using N storage units, N being a value of at least 1. The method may include allocating an amount of storage for a structure, said structure having M cells for storing said first portion and J cells for storing stop symbols, each cell of said structure having a size of more than N storage units; and copying said first portion of said input data into said structure while inserting said stop symbol between each predetermined number of symbols of said first portion, each symbol from said first portion and each of said inserted stop symbols being aligned on a boundary of a different cell of said structure. The structure may be an array where N represents a number of bytes, and each cell in said array has a size=2*N. The structure may be an array where N represents a number of bytes, and each cell in said array has a size that is an integer multiple of N. A first portion of said input data may be processed that includes M symbols, each symbol in said input data being represented using N storage units, N being a value of at least 1. The method may include allocating an amount of storage for a structure, said structure having M cells for storing said first portion, each cell of said structure having a size of P storage units, wherein P is an integer value that is greater than N; and copying said first portion of said input data into said structure while inserting said stop symbol between each predetermined number of symbols of said first portion, each symbol from said first portion being aligned on a boundary of a different cell of said structure, each of said stop symbols inserted having a value encoded in a first of said P storage units of one of said cells of said structure, wherein said first storage unit of said one cell is not used to represent a symbol of said input data. The method may include performing decompression processing to obtain said input data from said compressed data, said decompression processing including performing an inverse transform that is an inverse of said block sorting transform performed in connection with previously compressing said input data to obtain said compressed data. The block sorting transform and said move to front transform may be reversible transforms.

In accordance with another aspect of the invention is a method for processing input data comprising: receiving the input data; generating a compressed representation of the input data, said generating including performing first processing, said first processing including: using a transformation technique to transform the input data into first transformed data, wherein, prior to performing said transformation technique, said first processing includes generating an input stream including said input data with a stop symbol inserted between each set of L symbols in said input data, L being a non-zero integer. The transformation technique may be a block sorting technique and may be performed by executing instructions in parallel on a graphics processing unit of a computer. The first processing may include serially executing instructions on a central processing unit of a computer to perform a move to front transform and entropy encoding.

In accordance with another aspect of the invention is a computer readable medium comprising code stored thereon for processing input data, the computer readable medium comprising code for: receiving the input data; generating a compressed representation of the input data, said generating including performing first processing, said first processing including: using a block sorting transformation technique to transform the input data into first transformed data, wherein, prior to performing said block sorting transformation technique, said first processing includes generating an input stream including said input data with a stop symbol inserted between each set of L symbols in said input data, L being a non-zero integer. The block sorting transformation technique may be performed by executing instructions in parallel on a graphics processing unit of a computer The computer readable medium may further comprise code for partitioning the input data into a plurality of partitions, each of said partitions including M input data blocks; performing second processing for each of said partitions, said second processing including: copying said input data from first memory used by a central processing unit of a computer system to second memory of a device of the computer system, said device including a graphics processing unit that uses the second memory; inserting a stop symbol between each set of L symbols in said each partition of input data; and performing said block sorting transformation technique on each of said M input data blocks in said each partition in parallel by executing M blocks of threads in parallel, each of said M blocks of threads processing one of said M input data blocks, said M blocks of threads being including in a grid of threads executed on said graphics processing unit.

BRIEF DESCRIPTION OF THE DRAWINGS

Features and advantages of the present invention will become more apparent from the following detailed description of exemplary embodiments thereof taken in conjunction with the accompanying drawings in which:

FIGS. 5, 8A, 8B are examples illustrating use of a transformation in connection with techniques herein;

DETAILED DESCRIPTION OF
EMBODIMENT(S)

Figure 1:
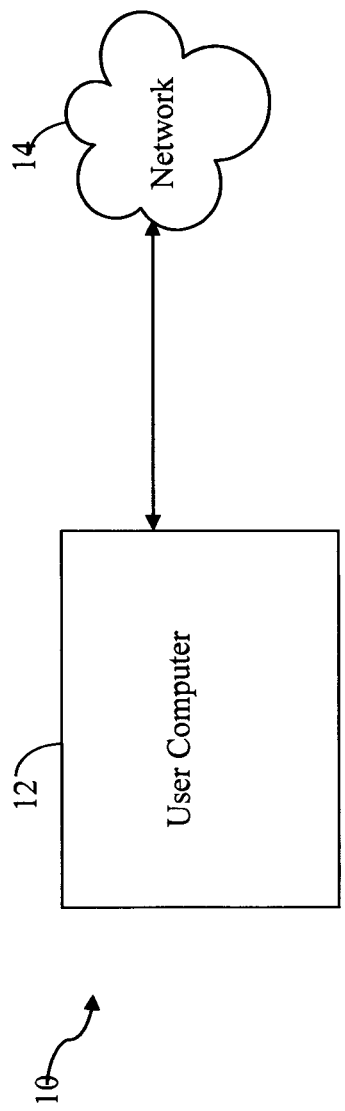
FIG. 1 is an example of an embodiment illustrating an environment that may be utilized in connection with the techniques described herein.

Referring to FIG. 1, illustrated is an example of a suitable computing environment in which embodiments utilizing the techniques described herein may be implemented. The computing environment illustrated in FIG. 1 is only one example of a suitable computing environment and is not intended to suggest any limitation as to the scope of use or functionality of the techniques described herein. Those skilled in the art will appreciate that the techniques described herein may be suitable for use with other general purpose and specialized purpose computing environments and configurations. Examples of well known computing systems, environments, and/or configurations include, but are not limited to, personal computers, server computers, hand-held or laptop devices, multiprocessor systems, microprocessor-based systems, programmable consumer electronics, network PCs, minicomputers, mainframe computers, distributed computing environments that include any of the above systems or devices, and the like.

The techniques set forth herein may be described in the general context of computer-executable instructions, such as program modules, executed by one or more computers or other devices. Generally, program modules include routines, programs, objects, components, data structures, and the like, that perform particular tasks or implement particular abstract data types. Typically the functionality of the program modules may be combined or distributed as desired in various embodiments.

Included in FIG. 1 are a user computer 12 and a network 14. The user computer 12 may include a standard, commercially-available computer or a special-purpose computer that may be used to execute one or more program modules. Described in more detail elsewhere herein are program modules that may be executed by the user computer 12 in connection with facilitating the data compression and/or decompression techniques described herein. The user computer 12 may operate in a networked environment and communicate with other computers not shown in FIG. 1.

It will be appreciated by those skilled in the art that although the user computer is shown in the example as communicating in a networked environment, the user computer 12 may communicate with other components utilizing different communication mediums. For example, the user computer 12 may communicate with one or more components utilizing a network connection, and/or other type of link known in the art including, but not limited to, the Internet, an intranet, or other wireless and/or hardwired connection(s).

Figure 2:
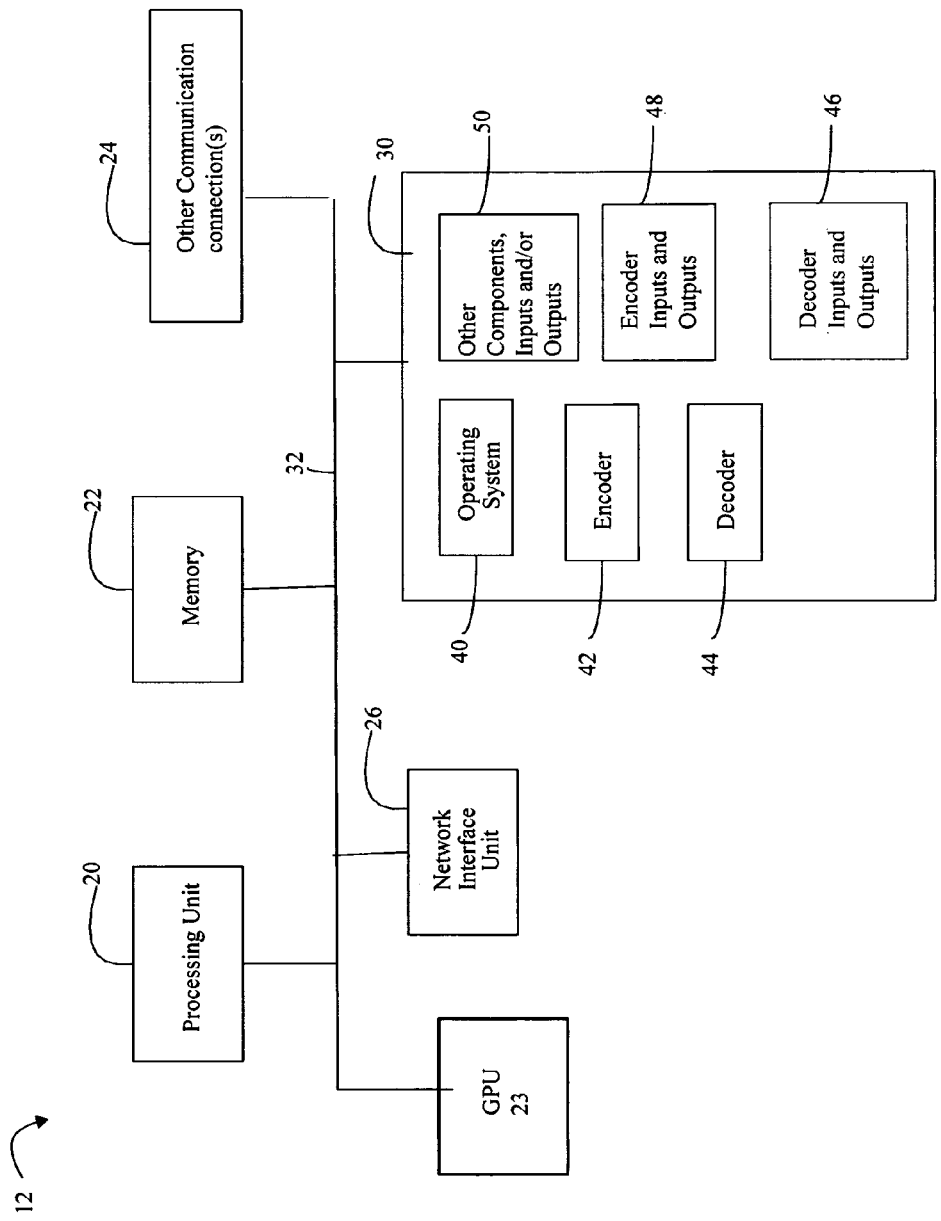
FIG. 2 is an example of components that may be included in an embodiment of a user computer for use in connection with performing the techniques described herein.

Referring to FIG. 2, shown is an example of components that may be included in a user computer 12 as may be used in connection with performing the various embodiments of the techniques described herein. The user computer 12 may include one or more processing units 20 (e.g., main CPUs or central processing units of the computer 12), memory 22, a GPU (graphics processing unit) 23, a network interface unit 26, storage 30, one or more other communication connections 24, and a system bus 32 used to facilitate communications between the components of the computer 12.

Depending on the configuration and type of user computer 12, memory 22 may be volatile (such as RAM), non-volatile (such as ROM, flash memory, etc.) or some combination of the two. Additionally, the user computer 12 may also have additional features/functionality. For example, the user computer 12 may also include additional storage (removable and/or non-removable) including, but not limited to, USB devices, magnetic or optical disks, or tape. Such additional storage is illustrated in FIG. 2 by storage 30. The storage 30 of FIG. 2 may include one or more removable and non-removable storage devices having associated computer-readable media that may be utilized by the user computer 12. The storage 30 in one embodiment may be a mass-storage device with associated computer-readable media providing non-volatile storage for the user computer 12. Although the description of computer-readable media as illustrated in this example may refer to a mass storage device, such as a hard disk or CD-ROM drive, it will be appreciated by those skilled in the art that the computer-readable media can be any available media that can be accessed by the user computer 12.

By way of example, and not limitation, computer readable media may comprise computer storage media and communication media. Memory 22, as well as storage 30, are examples of computer storage media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, (DVD) or other optical storage, magnetic cassettes, magnetic tape, magnetic disk storage or other magnetic storage devices, or any other medium which can be used to store the desired information and which can accessed by user computer 12. Communication media typically embodies computer readable instructions, data structures, program modules or other data. Combinations of the any of the above should also be included within the scope of computer readable media.

The user computer 12 may also contain communications connection(s) 24 that allow the user computer to communicate with other devices and components such as, by way of example, input devices and output devices. Input devices may include, for example, a keyboard, mouse, pen, voice input device, touch input device, etc. Output device(s) may include, for example, a display, speakers, printer, and the like. These and other devices are well known in the art and need not be discussed at length here. The one or more communications connection(s) 24 are an example of communication media.

In one embodiment, the user computer 12 may operate in a networked environment as illustrated in FIG. 1 using logical connections to remote computers through a network. The user computer 12 may connect to the network 14 of FIG. 1 through a network interface unit 26 connected to bus 32. The network interface unit 26 may also be utilized in connection with other types of networks and/or remote systems and components.

One or more program modules and/or data files may be included in storage 30. During operation of the user computer 12, one or more of these elements included in the storage 30 may also reside in a portion of memory 22, such as, for example, RAM for controlling the operation of the user computer 12. The example of FIG. 2 illustrates various components including an operating system 40, an encoder 42, a decoder 44, decoder inputs and outputs 46, encoder inputs and outputs 48, and other components, inputs, and/or outputs 50. The operating system 40 may be any one of a variety of commercially available or proprietary operating systems. The operating system 40, for example, may be loaded into memory in connection with controlling operation of the user computer.

The encoder 42 and decoder 44 may be used in connection with a compression/decompression system utilizing the techniques described herein. The encoder inputs and outputs 48 collectively represents the various inputs and outputs of the encoder 42. The decoder inputs and outputs 46 collectively represent the various inputs and outputs of the decoder 44. The encoder 42 may be used in connection with compressing received input data generating compressed output data. The decoder 44 may be used in connection with decompressing compressed data, as produced by the encoder 42, to generate a lossless construction of the original or source input data. The foregoing components included in FIG. 2 are described in more detail in following paragraphs.

Although the components, such as the decoder and encoder, are shown as being included in a single computer system, the components may be included on different computer systems and operate in accordance with the techniques described herein. For example, a decoder may be included on a user computer. An encoder and associated encoder inputs and outputs may be located on another computer system connected to the user computer 12 through the network 14 as illustrated in FIG. 1. During operation, the encoder on the other computer system may compress source data and generate a compressed output. The user computer may download the compressed data which is then used as input to the decoder executing on the user computer. The foregoing, and other variations of the exemplary embodiments described herein, will be appreciated by those of ordinary skill in the art.

Figure 3:
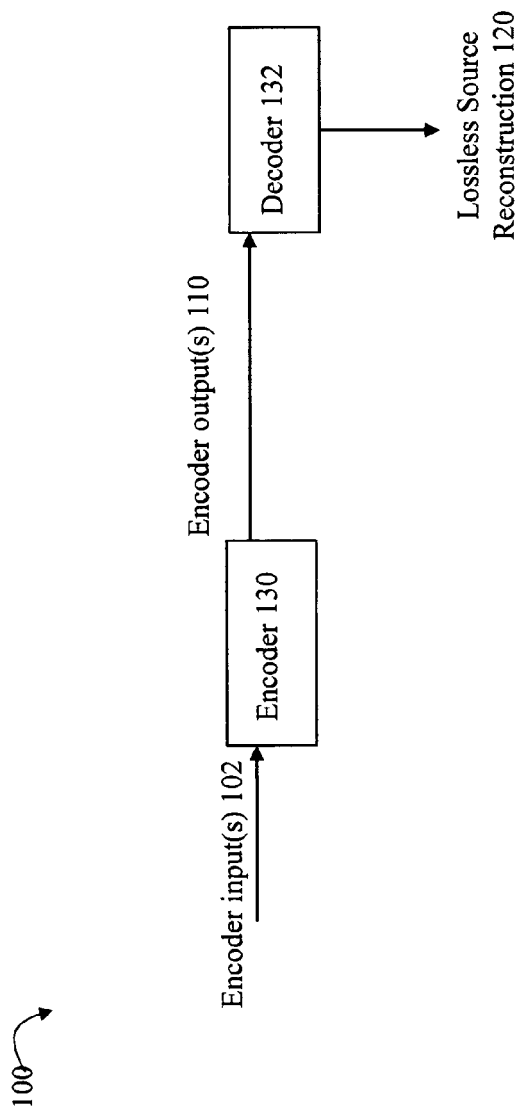
FIGS. 3, 4, 9, 10, and 11 are examples of components that may be included a compression system.

Referring to FIG. 3, shown is an example of an embodiment of an encoder and decoder as may be included in a compression system such as one that performs lossless data compression/decompression in accordance with the techniques described herein. The example 100 includes an encoder 130 and decoder 132. The encoder 130 takes one or more inputs 102 including the source data and, optionally, other inputs as may vary with embodiment of the techniques herein, and produces outputs. The encoder 130 may generate one or more encoder outputs 110 and may include a compressed source and, optionally, one or more other outputs as may vary with the particular compression techniques utilized in an embodiment in accordance with techniques herein. As known in the art, one class of data compression techniques is generally known as lossless data compression techniques in which the exact original information is reconstructed from the compressed form. Such techniques of lossless data compression class may be used when it is important that the original and decompressed forms remain bitwise identical. As such, an embodiment in accordance with the techniques herein may perform lossless data compression.

As described in more detail below, an embodiment of a compression/decompression system such as illustrated in FIG. 3 may utilize one or more techniques.

Figure 4:
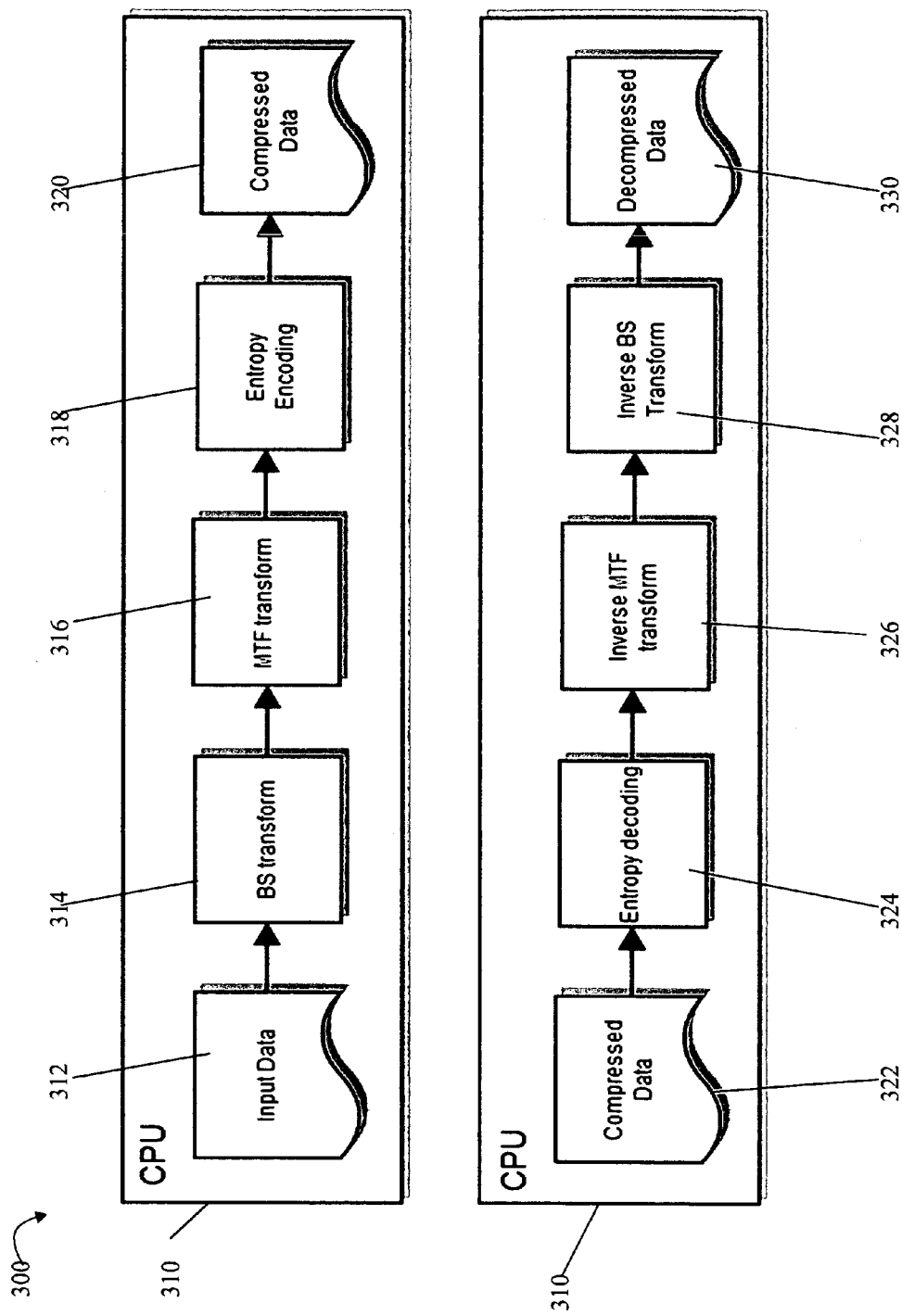

Referring to FIG. 4, shown is an example illustrating processing as may be generally performed in connection with data compression and decompression. The processing illustrated in 310, 320 of FIG. 4 may be performed by code executing serially on a CPU without performing parallel processing such as using a GPU as in an embodiment in accordance with techniques herein described in more detail below. The example 300 illustrates processing 310 as may be performed by an encoder in connection with data compression where such processing uses a lossless block-sorting based data compression algorithm executed on CPU. Element 310 illustrates a sequential block-sorting based compression scheme that treats the input data as a sequence of independent data blocks of a certain size. The processing of 310 includes providing input data 312 to a Block-Sorting Transform (BS) 314. The output of 314 is provided as an input to the Move To Front Transform (MTF) 316 or any other suitable transformation technique. Although MTF is mentioned herein as a particular transform that may be used as 316, element 316 may more generally represent any locally-adaptive transformation. The output of 316 is provided as an input to the Entropy Encoder 318 (e.g. run length encoder, Huffman encoder, or Arithmetic Encoder), to produce the compressed data 320. An implementation in accordance with techniques herein may use, for example, the MTF transform as 316 in combination with run-length encoding as 318 to ensure good compression of repetitive symbol sequences, where such repetitive symbol sequence are as collected together by the BWT transform as 314. Element 320 illustrates a sequential block-sorting based decompression scheme that decompresses the compressed data 320. The processing of 320 includes providing compressed data 322 to entropy decoding 324. The output of 324 is provided as an input to the Inverse MTF Transform 326. The output of 326 is provided as an input to the Inverse BS transform 328 to produce the decompressed data 320 (which should be the same as the original input data 312 in lossless compression).

As known in the art, each of the steps 314, 316 and 318 has reverse or inverse processing performed, respectively, in steps 324, 326 and 328. For example, an implementation of the original Burrows-Wheeler transform (BWT, also referred to as block-sorting compression and reversible block-sort transform) is one example of a BS transform that may be performed in an embodiment in connection with techniques herein. The modified versions of the BWT transform as also described herein are also reversible.

Additional detail will now be provided regarding the BWT and MTF transforms (and their inverses) and entropy encoding/decoding as described in connection with FIG. 4 processing elements.

The Burrows-Wheeler transform (BWT, also called block-sorting compression), is an algorithm known to those of ordinary skill in the art in connection with data compression techniques. The original BWT algorithm or technique was developed by Michael Burrows and David Wheeler such as described, for example, in Burrows M and Wheeler D (1994), *A block sorting lossless data compression algorithm*, Technical Report 124, Digital Equipment Corporation, ("original BWT technique or algorithm"), which is incorporated by reference herein. When a character string is transformed by the BWT, none of its characters change value. The transformation permutes the order of the characters. If the original string had several substrings that occurred often, then the transformed string will have several places where a single character is repeated multiple times in a row. This is useful for compression in subsequent processing since the output generated by the original BWT (and also optimizations, variations or other versions thereof such as a modified BWT described herein) tends to be easy to compress in that it has runs or groupings of repeated characters. The BWT transform is performed by sorting all rotations of the input data text in lexicographic order, then taking the last column. For example, the text "^BANANA@" is transformed into "BNN^AA@A" through these steps (the @ character indicates the "end of sequence" (e.g., may be implemented by inserting an actual character meaning end of sequence or storing a location as to the position denoting the end of the sequence) and "^" indicates a space).

The following provides a general pseudo-code description of processing performed by the original BWT technique and also its inverse as described in more detail below:

```
function BWT (string s)
    create a table, rows are all possible rotations of s
    sort rows alphabetically
    return (last column of the table)

function inverseBWT (string s)
    create empty table
    repeat length(s) times
        insert s as a new first column of table (e.g., before
        current first column of the existing table
                // first insert creates first column
        sort rows of the table alphabetically
    return (row that ends with the 'EOF' character)
```

Figure 5:
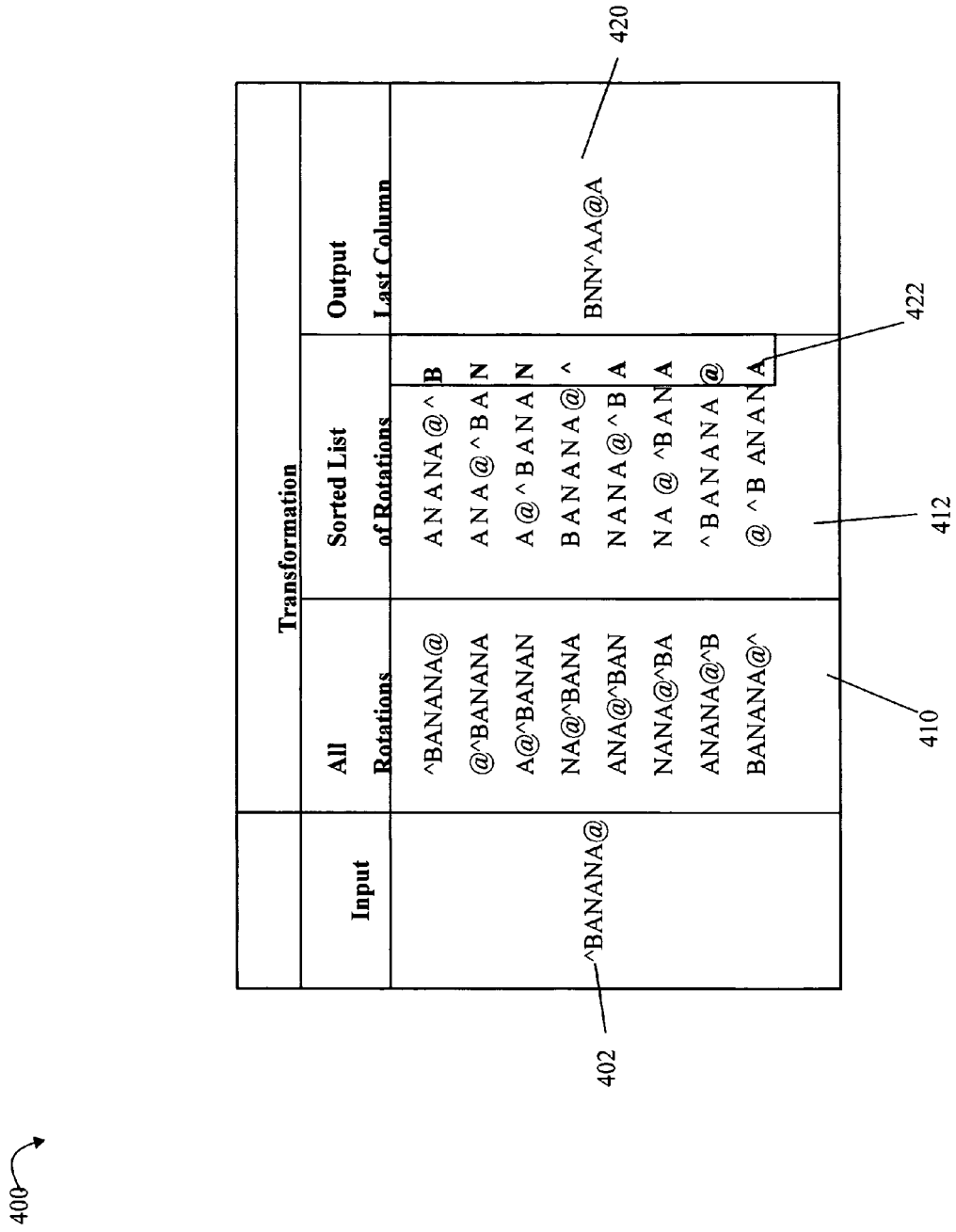
Figure 6:
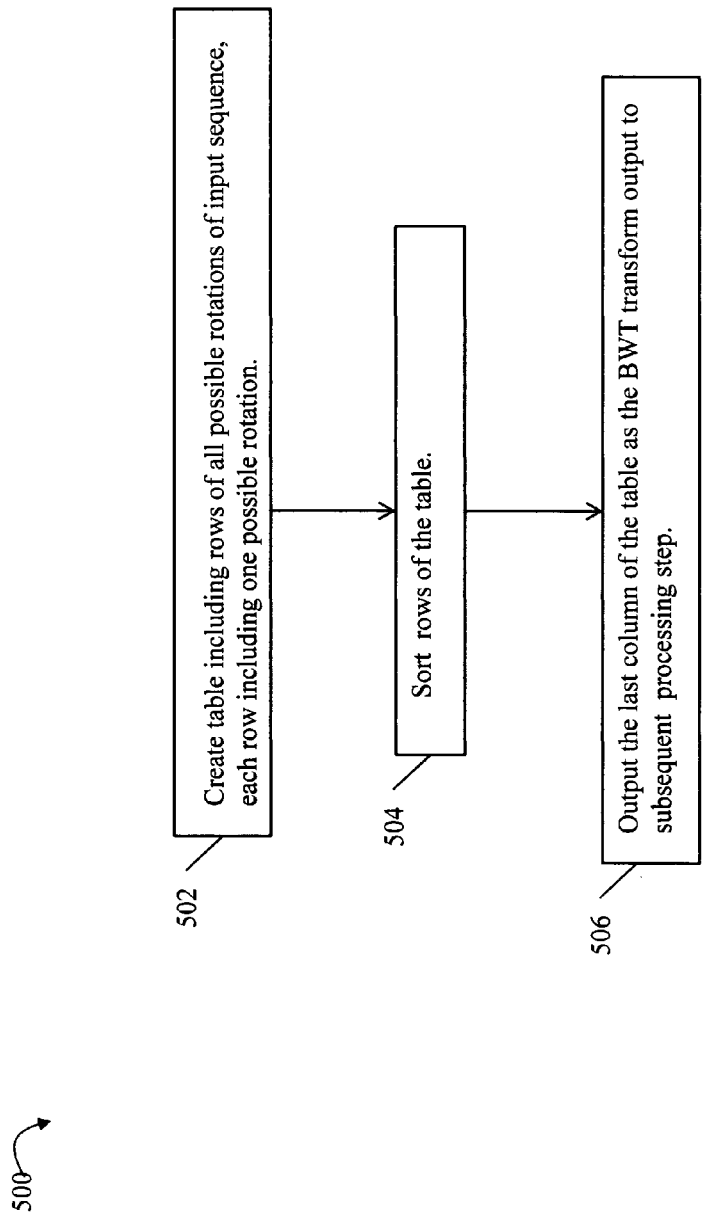
FIGS. 6, 7, 12, 13 and 16 are flowcharts of processing steps that may be performed in an embodiment in accordance with techniques herein.

With reference to FIGS. 5 and 6, what will now be described are general processing steps of the original BWT technique (FIG. 6) with an illustrative example (FIG. 5). At step 502 of FIG. 6, a table 410 of FIG. 5 is created including rows of all possible rotations of a given input sequence where each row includes one possible different rotation of the input 402 of FIG. 5. At step 504, the rows of the table 410 are sorted to produce the sorted list of rotations 412 of FIG. 5. The sorted list of rotations 412 may be produced using any suitable sorting technique so that in 412, sorted row (i)<=sorted row (i+1). The sorting may be based on a defined lexicographical ordering of the alphabet or possible set of characters in the input sequence. At step 506 of FIG. 6, the last column of the table 422 of FIG. 5 is the output 420 of the BWT transform. As described elsewhere herein, the output 420 may be provided as an input to a next subsequent processing step in data compression processing such as an input to the MTF transform.

Figure 7:
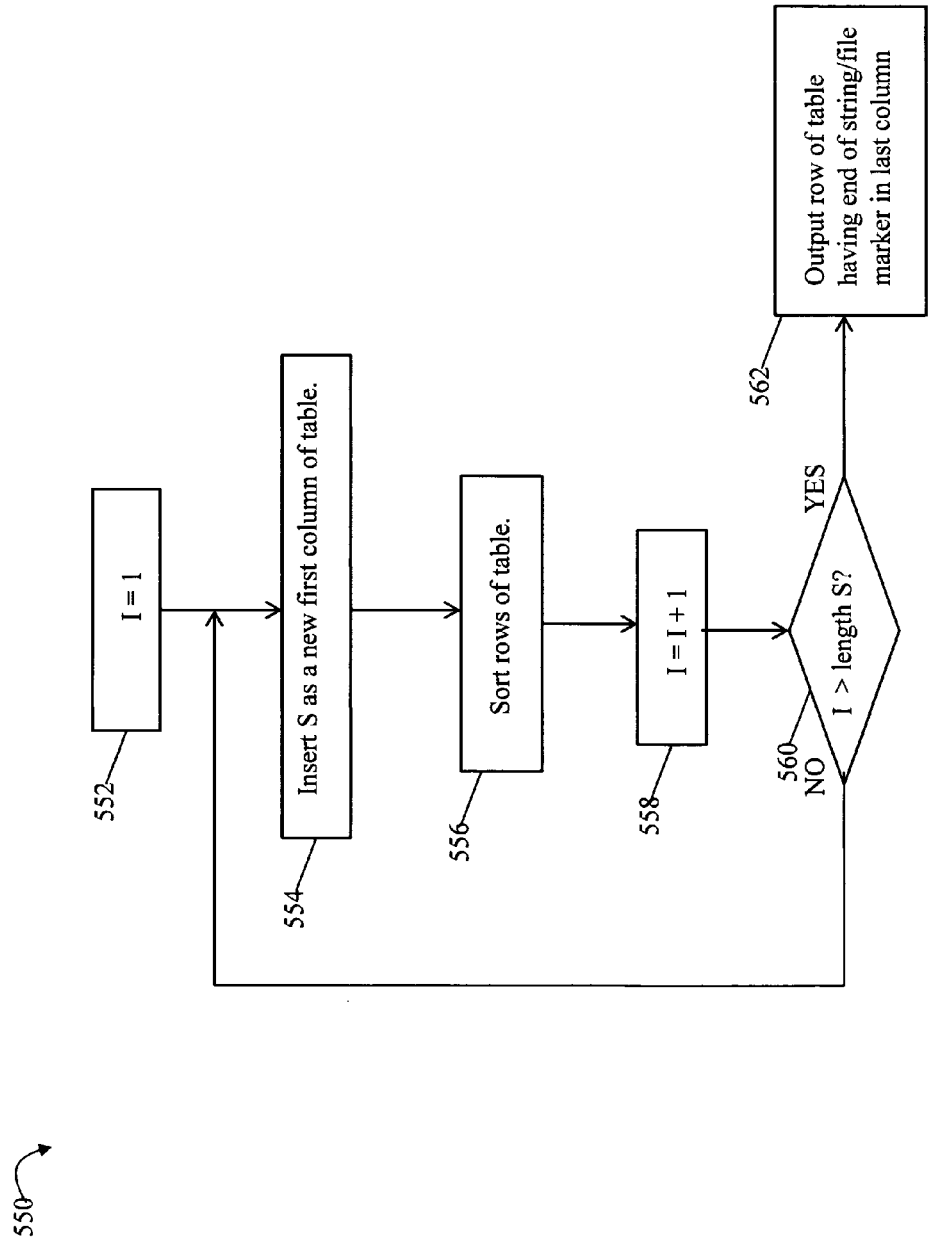
Figure 8B:
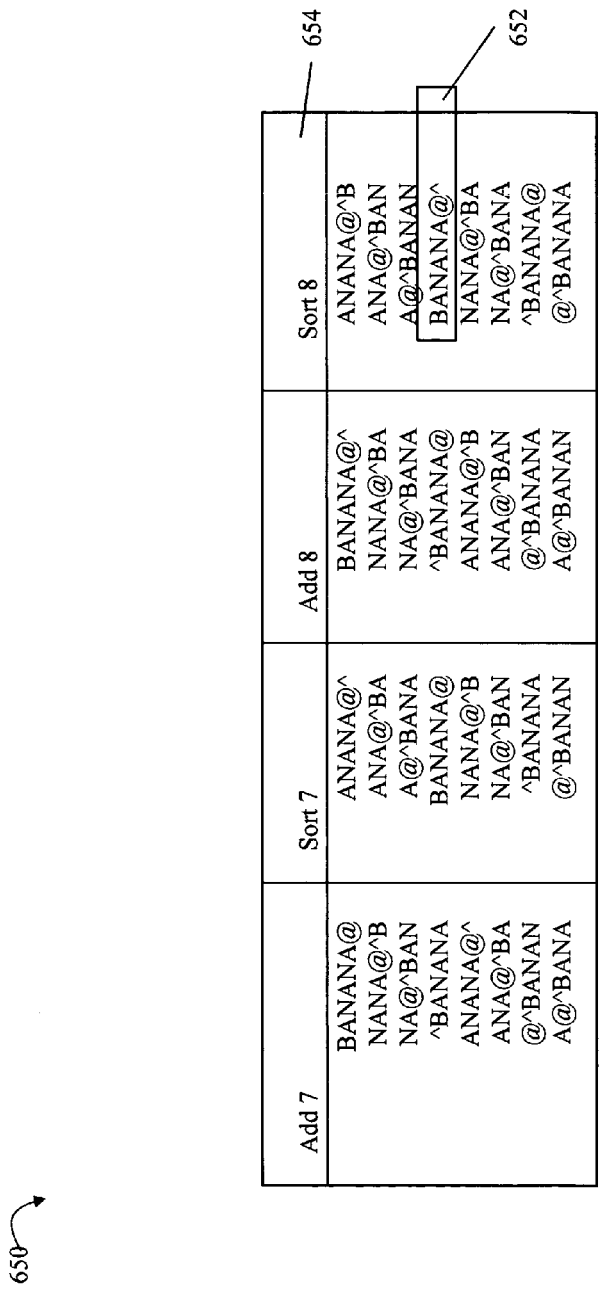

As noted elsewhere herein, the BWT transform is also reversible in that original input sequence can be regenerated from the last column data (e.g., the stored decompressed data). With reference now to FIGS. 7 (flowchart of processing steps), 8A and 8B (example data), the BWT inverse may perform processing summarized as follows. At a first step 552 of FIG. 7, initialize a counter I=1. Processing of the flowchart 550 of FIG. 7 iteratively builds a table of columns. At step 554, the compressed data, S (which serves as input to the inverse BWT processing) is inserted as a new first column of the table. At step 556, the rows of the table are sorted in a manner as described in connection with step 504 of FIG. 6. At step 558, I is incremented by 1. At step 558, a determination is made as to whether I is greater than the length of S. If not, processing continues with step 554. If step 560 evaluates to yes, control proceeds to step 562 where the output of the BWT inverse processing is the row of the table having the end of string/file marker in the last column. With reference to FIGS. 8A and 8B, shown is an example illustrating performing the foregoing for an input 602. Each box labeled "ADD I" denotes the current table with the addition of a newly inserted first column (step 554 of FIG. 7) for the Ith iteration of the loop including step 554, 556, 558 of FIG. 7. Each box labeled "SORT I" denotes the current table from "ADD I" sorted (step 556 of FIG. 7) for the Ith iteration of the loop. When step 560 evaluates to yes, the table is as provided in 654 of "Sort 8" and the output of the BWT inverse processing is 652.

Figure 16:
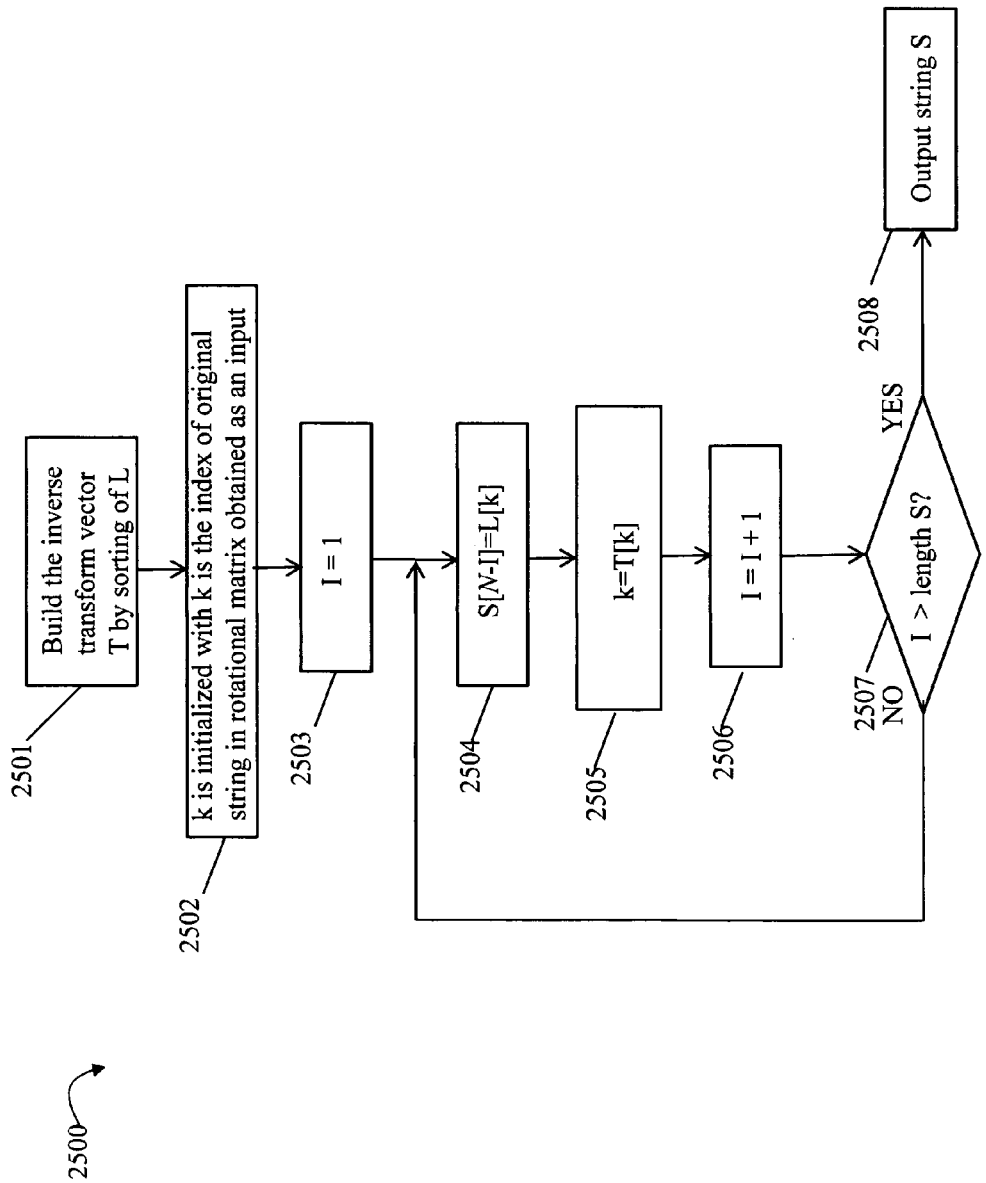

It should be noted that in connection with an implementation of the BWT technique (original or variations described herein) may include one or more processing optimizations to improve efficiency. For example, in both the direct and inverse BWT transform an embodiment may perform other techniques rather than generate and store in memory the entire table of input buffer rotations. For example, for processing of the BWT transform (e.g., as in connection with 314 of FIG. 4), comparison of rows i and j of the table at a point in time in connection with sorting processing (e.g., step 556 of FIG. 7) may be replaced by comparison of two substrings starting from at the i-th and j-th offset in the input buffer respectively (e.g., and wrapping back to the end of input buffer when the comparison reached the end of buffer for the first or second substring). Also, although some embodiments may insert a special end of file/end of string marker to denote the end of the input data in connection with processing, some embodiments may use other suitable techniques to avoid inserting a special end of string/file marker in the input data. For example, rather than insert a special end of file/end or string marker, the position k of the first symbol of the input string in the BWT transformed string may be tracked during sorting and passed to inverse BWT transform processing (e.g., element 328 of FIG. 4). As another optimization, the inverse BWT transform may be performed without building and storing in memory the entire table of input buffer rotations. It should be noted, that after adding a new column to the rotation matrix described above (e.g., step 554 on the FIG. 7) all the rows of this matrix are already ordered lexicographically starting with the second character. This means that all the rows which start with the same character are lexicographically ordered and it is possible to perform sorting only by the first column of characters L which was inserted (ordering of the strings with the same first character is performed on the previous stage). So, the result of column L sorting (denoted as F) can be obtained as F[T[j]]=L[j], where T may be referred to as an inverse transform vector and j is the row number. Using this relation, the output of the inverse BWT transform, S, may be constructed as S[N−1−i]=L[T$^i$[k]], where k is the index of the original string in the rotational matrix (e.g., stored during encoding phase), T$^{i+1}$[x]=T[T$^i$[x]] and T$^0$[x] =x, "i" is the value of "I" (e.g., loop counter I in following steps of FIG. 16), and N is the length of S. The processing steps of the enhanced inverse BWT transform are depicted on FIG. 16. First the inverse transform vector T is constructed at step 2501. In step 2502, the value of k is initialized with the index of the original string in rotational matrix (obtained from the encoding step). At step 2503, the counter I is initialized to 1. At step 2504, the symbol of the output buffer S is retrieved at position k from the symbol of input buffer L. The value of k is updated at step 2505 and the value of I is incremented at step 2506. At step 2507, a determination is made as to whether I is greater than the length of S. If not, processing continues with step 2504. If step 2507 evaluates to yes, control proceeds to step 2508 where the result of BWT inverse processing S is outputted.

The move-to-front transform (or MTF) is an encoding of data (typically a stream of bytes) designed to improve the performance of subsequently performed entropy encoding techniques of compression. The MTF transform is known to those or ordinary skill in the art such as described, for example, in Ryabko, B. Ya. Data compression by means of a "book stack", Problems of Information Transmission, 1980, v. 16: (4), pp. 265-269, which is incorporated by reference herein. In MTF, the general technique is that each symbol in the data is replaced by its index in a stack of "recently used symbols". For example, long sequences of identical symbols are replaced by as many zeroes, whereas when a symbol that has not been used in a long time appears, it is replaced with a large number. Thus at the end of MTF processing, the data input to MTF processing is transformed into a sequence of integers where if the data exhibits a lot of local correlations, then these integers tend to be small.

As a simple example, assume that the symbols in the data input to the MTF transform are bytes. Each byte value is encoded by its index in a list of bytes, which changes over the course of the MTF processing. The list is initially in order by byte value (0, 1, 2, 3, . . . , 255). Therefore, the first byte is always encoded by its own value. However, after encoding a byte, that value is moved to the front of the list before continuing with the next byte of the input data. To further illustrate, assume we are encoding values in the lower case alphabet "a-z" and MTF processing is performed on the following sequence as input data: bananaaa. The list is initially (abcdefghijklmnopqrstuvwxyz). The first letter in the sequence is b, which appears at index 1 of the list (e.g., assuming the list is zero-based and thereby indexed from 0 to 25, for a . . . z, respectively). As this point, a 1 is added to the output stream "1" and the "b" moves to the front of the list so the list is now: (bacdefghijklmnopqrstuvwxyz). The next letter in the sequence of the input data is "a", which now appears at index 1 of the list and a 1 is then added to the output stream so that the current output stream is "1, 1". The letter "a" is moved back to the top or beginning of the list. Continuing processing with the remainder of the input data sequence, the input data sequence may be encoded as: 1,1,13,1,1,1,0,0. The following summarizes the MTF processing to generate the encoded sequence as the output

| Iteration | Encoded Sequence | List |
|---|---|---|
| bananaaa | 1 | (abcdefghijklmnopqrstuvwxyz) |
| bananaaa | 1,1 | (bacdefghijklmnopqrstuvwxyz) |
| bananaaa | 1,1,13 | (abcdefghijklmnopqrstuvwxyz) |
| bananaaa | 1,1,13,1 | (nabcdefghijklmopqrstuvwxyz) |
| bananaaa | 1,1,13,1,1 | (anbcdefghijklmopqrstuvwxyz) |
| bananaaa | 1,1,13,1,1,1 | (nabcdefghijklmopqrstuvwxyz) |
| bananaaa | 1,1,13,1,1,1,0 | (anbcdefghijklmopqrstuvwxyz) |
| bananaaa | 1,1,13,1,1,1,0,0 | (anbcdefghijklmopqrstuvwxyz) |
| Final | 1,1,1,13,1,1,1,0,0 | (anbcdefghijklmopqrstuvwxyz) |

As known in the art, the MTF transform is also reversible as may be used in connection with decoding or decompression processing. For example, the same original list (e.g., (abcdefghijklmnopqrstuvwxyz)) is obtained and decoding may be performed by replacing each index in the encoded stream with the letter at that index in the list. Note that a difference between this decoding and the encoding method is that the index in the list is used directly instead of looking up each value for its index. For example, start with (abcdefghijklmnopqrstuvwxyz). Take the "1" (first element) of the encoded sequence and look it up in the list, which results in "b" (zero-based list index). Then move the "b" to the front of the list which results in the list being (bacdef . . . ). Taking the next or second element of the encoded sequence which is also "1", look up "1" in the current list, which results in "a", and move "a" to front of the list, and so on.

The MTF transform may be characterized as taking advantage of local correlation of frequencies to reduce the entropy of a message (e.g., recently used letters stay towards the front of the list. If use of letters in the input sequence exhibits local correlations, MTF processing results in a large number of small numbers such as "0"'s and "1"'s in the output). In connection with the MTF in combination with a version of the BWT technique, such as the original BWT or the modified BWT described herein, a version of the BWT algorithm may be characterized as good at producing a sequence that exhibits local frequency correlation from text and certain other special classes of input data so that an embodiment performing compression upon such types or classes of input data may benefit from such a combination (e.g., performing a version of the BWT technique with an MTF transform before a final entropy-encoding step).

As known to those of ordinary skill in the art, entropy encoding may be characterized as a coding scheme that involves assigning codes to symbols so as to match code lengths with the probabilities of the symbols. Typically, entropy encoders are used to compress data by replacing symbols represented by equal-length codes with symbols represented by codes of length proportional to the negative logarithm of the probability. Therefore, the most common symbols use the shortest codes. Encoding techniques that may be used in an embodiment in accordance with techniques herein may include, for example, using Huffman encoding (e.g., see D. A. Huffman, "A Method for the Construction of Minimum-Redundancy Codes", Proceedings of the I.R.E., September 1952, pp 1098-1102, which is incorporated by reference herein).

In one embodiment in accordance with techniques herein, rather than perform all processing steps for compression and decompression such as illustrated in FIG. 4 by executing code of a CPU sequentially, the processing such as illustrated in FIG. 4 may be partitioned so that a portion of the processing may be performed by the GPU. For example, as will be described in more detail herein, an embodiment in accordance with techniques herein may perform processing of the BS transform 314 (e.g. either as the original BWT technique, the modified BWT technique described elsewhere herein, or, more generally, any other suitable implementation, variation or optimized version of the BWT technique) on the GPU. With reference back to FIG. 4, among the three basic data transformations steps 314, 316 and 318, BS Transformation 314 has, from the inventor's point of view, many opportunities to perform parallel processing and, at the same time, it typically takes the longest of all the steps 314, 316 and 318 (e.g., step 314 may consume up to 80% of the total amount of compression processing time based on the inventor's experience). Thus, an embodiment may execute processing for the BS transform 314 on the GPU.

Figure 9:
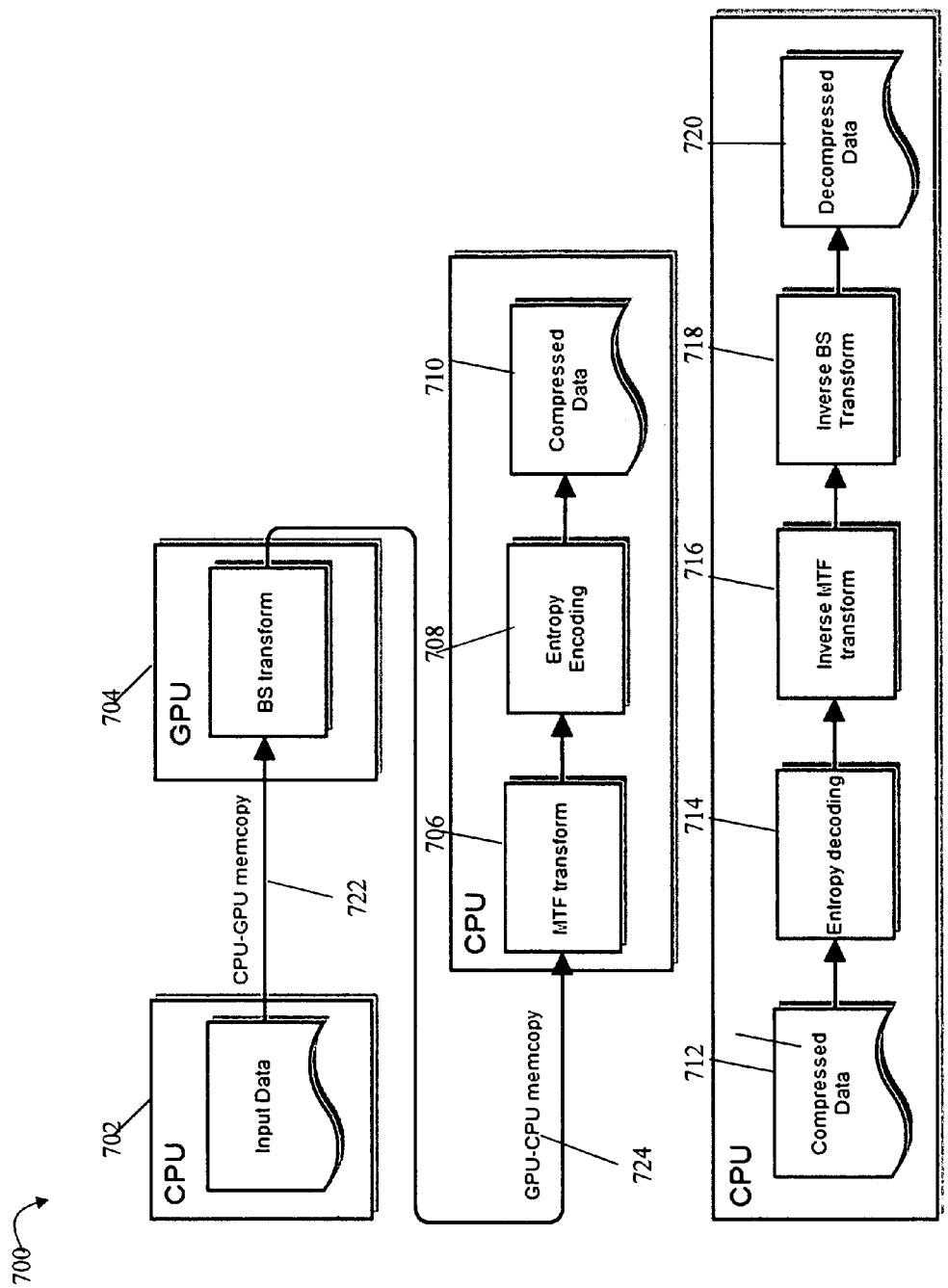

Referring to FIG. 9, shown is a diagram illustrating processing flow as may be performed in an embodiment in accordance with techniques herein using the CPU and GPU. At step 702, the input data may be stored in CPU memory which is then copied 722 to GPU memory. In step 704, processing for Block-sorting Transformation (e.g., step 314 of FIG. 4) may be performed on the GPU. At step 724, the resulting data output from the BS transform is copied from GPU memory to the CPU memory. The remaining encoding operations (MTF 706 and entropy encoding 708) may be performed by executing code on the CPU to generated compressed data 710. In the particular embodiment illustrated in FIG. 9, the decompression processing of 712, 714, 716 and 718 to generate decompressed data 720 may be performed entirely on the CPU. However, it will be appreciated that an embodiment may also perform processing of other portions of the processing for compression/decompression on the GPU as may be desirable and suitable in a particular embodiment.

An embodiment in accordance with techniques herein may perform processing such as described herein using serial and parallel processing performed by processing units. For example, as noted above, an embodiment may perform a portion of the processing using a CPU (central processing unit) of a computer system which executes code serially (e.g., one instruction at a time) and by programming a parallel processing unit, such as a graphics processing unit (GPU) which can execute multiple instructions at a time. The GPU may be included in a computer system or other system, such as a data storage system, which performs compression and/or decompression. The code, when executed on the one or more GPUs, may perform at least some of the processing steps as described herein in a parallel fashion.

Processing as described herein as being performed by the GPU may also be performed by other hardware component(s) providing similar functionality to that of the GPU. In an embodiment of the techniques herein, not all processing steps may be performed by code executed by the GPU. Rather, such as mentioned above, an embodiment may select to perform processing steps which are computationally intensive and amenable for parallelization using the GPU while performing other processing serially in the CPU. For example, as noted above, an embodiment in accordance with techniques herein may perform steps related to block sorting in connection with data compression in parallel using the GPU while executing other processing steps serially using a CPU. Both the CPU and one or more GPUs may be included in the same system as described in more detail in exemplary embodiments elsewhere herein. Code that executes in the GPU may be programmed, for example, using the CUDA programming language designed to exploit parallel processing characteristics of the GPU. The GPU can handle thousands of concurrent programming threads, each running one element of a parallel computation. To facilitate parallel programming, CUDA organizes these threads in blocks, and the threads blocks are organized in a grid. The threads in a thread block can be indexed in one, two, or three dimensions, and the grid can be indexed in one or two dimensions. In an embodiment described herein in following paragraphs, the function calls that run in the GPU are called "kernels", and are launched from the CPU. Each kernel corresponds to a portion of parallel code that may be executed by multiple threads, where such threads are organized into a number of blocks. A "grid" of blocks may be run as a unit of computation on the GPU where all threads in the grid may executed concurrently.

As described herein, the CPU may be included in a computer (e.g. as one of the main CPU(s) of the computer), and the GPU may be located, for example, on a plug-in card of the computer referred to as the "device". Thus, the CPU and GPU may be included in the same system (such as the same computer system) and may communicate, for example, using a bus such as a PCIe (Peripheral component interconnect express). The device may have different types of memory forming a memory hierarchy each with different size, speed, and usage. For example, the following may be types of memory of the device: device or global memory, MP (multi processor) shared memory, and a register file. MPs as described in more detail below. Of the foregoing types of memory, the device or global memory may be the most abundant, may be uncached and may typically be the slowest memory type to access. Shared memory may be characterized as an area of memory that is uncached and shared across a block of threads. A register file (RF) may include memory resources assigned to a particular thread (e.g., by dynamically partitioning such resources of the RF across threads of a particular MP). Typical data flow between the CPU and GPU may include the CPU copying data to the GPU, usually to the GPU's device or global memory. Instructions such as those included in the kernel may also be copied to shared device global memory of the GPU. The GPU then asynchronously executes code of the kernel (e.g. multiple threads concurrently execute the same portion of code corresponding to the kernel). When the computer's CPU executes code that makes a call to copy data from GPU memory back to computer memory, the call will block until all threads have completed processing and the output data is available. At this point, the results, such as the output data, are transmitted from the GPU to the CPU.

In one embodiment in accordance with techniques herein, the CPU reads a set or chunk of input data blocks and saves it into host memory. Then, the set of input data blocks is copied from the CPU memory into device memory of the GPU to start processing the set of input data blocks in the GPU. From this point, all processing on the set of input data blocks is done in the GPU and all intermediate and final results produced are saved into device memory of the device including the GPU. The device memory of the GPU is accessible and used by the GPU. However, the device memory is not directly accessible for use by the CPU. When all input data blocks in the current set or chunk have been processed in the GPU, the results are copied from device memory of the GPU to the CPU's memory, and may then be further processed by subsequent compression processing steps. Data may be stored in device and other memories of the GPU as CUDA arrays (a type of data a construct in CUDA).

In general, modern GPU components may include several Multiprocessors (MPs) and global memory (which is accessible by all MPs). At the same time, each MP includes several streaming processors (SPs), a register file and a shared memory (e,g, shared among components within a single MP). The SPs of a certain MP use the common instruction fetch (IF) module. As noted elsewhere herein, the register file has the fastest access time, the shared memory has the medium access time, while global memory has the worst access time. Therefore, any algorithm needs to be divided into threads to be executed on GPU. These threads are organized into thread blocks. All these blocks while executing a same set of code or instructions (e.g., so-called, kernel) form the grid. Each block is executed on a certain MP. Each thread utilizes some number of the registers from the MP thread pool. All the threads of a certain block can access the MP shared memory and the device global memory. The number of threads in a certain block may be much larger than the number of SPs in a MP; therefore, these threads are scheduled to a certain SP automatically by an instance of the MP hardware. Based on the foregoing, processing that may be performed on the GPU may have certain characteristics or attributes making such processing a desirable candidate for execution on the GPU. Such characteristics making processing a desirable candidate for GPU execution may include processing that is: divisible into many independent tasks, not memory intensive (e.g., slow global GPU memory access count is much less than relatively fast shared MP memory access count), has a memory access pattern which allows coalescing memory access by different threads executing on the GPU hardware, and produces a limited amount of branching (e.g., because the branchings in threads may be executed sequentially). As such, the BS transform processing (and also the inverse BS transform processing) may be characterized as good candidates for GPU processing. It should be noted that processing performed in connection with GPUs may have as one consideration or goal of maximizing bandwidth and one of the optimizations may be memory coalescing as noted above. Memory coalescing may be characterized as grouping together aligned reads or writes that have good locality. Each coalesced memory access may use a single address and request to move large portions data in the single request. For example, there may be a number of threads executing the same kernel in parallel at a point in time where each of these threads accesses a same large portion of memory such as of global memory. Each of these threads may be accessing, such as reading, a different sequential position in bank of memory. Operations may be performed to access the entire bank with a single memory request rather than multiple requests for data by each of the threads. Memory access coalescing occurs when the GPU can make one request to the global memory to fetch or set a number of memory locations. This may occur, for example, on the Nvidia GPUs when each thread accesses a memory location that is exactly n larger than the thread memory location access before it, where n is the size of the data value and limited to sizes of 4 and 8.

Figure 10:
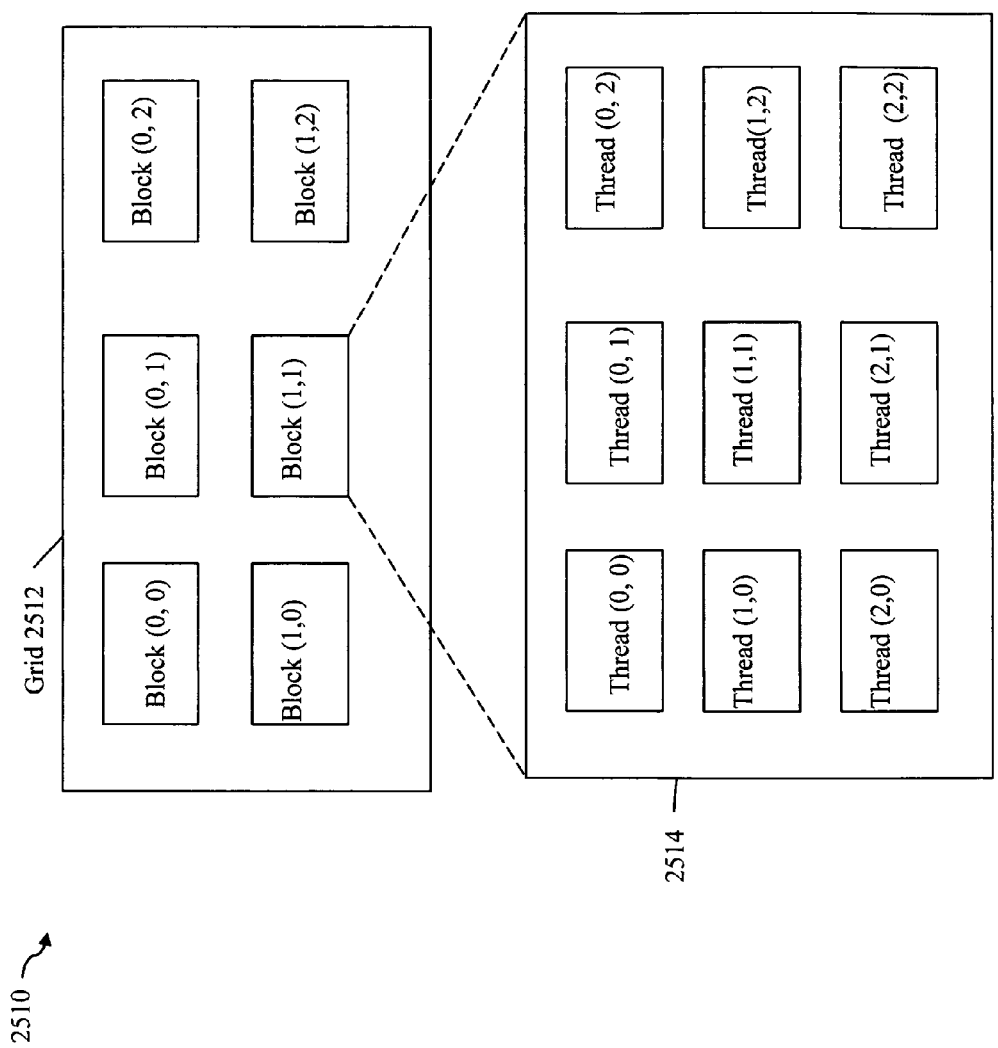

Referring to FIG. 10, shown is an example illustrating the foregoing thread hierarchy that may be used in an embodiment in accordance with techniques herein. The example 2510 provides a general representation of the thread hierarchy that includes a grid 2512 of thread blocks. Each thread block in 2512 may include multiple threads as illustrated by 2514. All threads in a block run the same kernel or set of instructions. A thread block may have one, two or three dimensions although two dimensions are illustrated in connection with 2514. The maximum number of threads in a block may vary with the particular system. All thread blocks in the grid 2512 have the same size and run the same kernel. Thus, all threads in a grid executing a same kernel may be executed in parallel. A grid may have one or two dimensions although two dimensions are illustrated in 2510. The foregoing is a general representation of the thread hierarchy that may be used in one particular embodiment as described herein. Additional details regarding what data may be processed in parallel, what processing may be performed in parallel (and thereby included in a single kernel), and the like, as may be included in an embodiment in accordance with techniques herein are described elsewhere herein in more detail.

Following paragraphs set forth exemplary embodiments utilizing parallel processing and, as will be appreciated by those of ordinary skill in the art, may be more generally applied for use with a different number of dimensions, by varying the partitioning of processing performed by the CPU (e.g., serially) and by the GPU (e.g, in parallel), using a different number of GPUs, and the like. A set of input data may be partitioned into multiple input data blocks of a certain size. A chunk or set of the input data blocks may be read at a time and stored in memory of the GPU prior to the GPU commencing processing of the set of input data blocks.

Taking into account the GPU architecture such as described above, with reference now to FIG. 11, shown is one way in which the combined CPU-GPU block-sorting compression (e.g. processing of 310 from FIG. 4) may be partitioned. Input data is partitioned for processing into data blocks 802 of a certain size. These blocks are processed independently. The first "m" input data blocks are copied 804 to GPU device memory. A thread grid 806a including m thread blocks (e.g., thread blocks 1 . . . m, such as denoted 808a-808m) is executed on a single GPU processor (e.g., single MP) at a first point in time. Each of these thread blocks 808a-808m receives one input data block as an input and may perform the Block-Sorting Transformation on it. Once the BS transform for blocks #1 . . . m is finished as illustrated by 806a, the resulting data for these blocks is copied back from the GPU memory to CPU memory 810 and the next set of "m" input blocks (blocks m+1 . . . 2m) are transferred 813 to the GPU memory. The calculation of Block-Sorting Transformation for blocks #m+1 . . . 2m is executed on the GPU (e.g., by the thread grid such as illustrated by 806b). At the same time the thread grid 806b is processing the second set of m input data blocks, calculations of MTF Transform 812 and Entropy Encoding 814 are executed on the CPU for Blocks 1 . . . m. The foregoing may be repeated until all the input blocks are processed to produce a corresponding set of encoded blocks 850.

Figure 11:
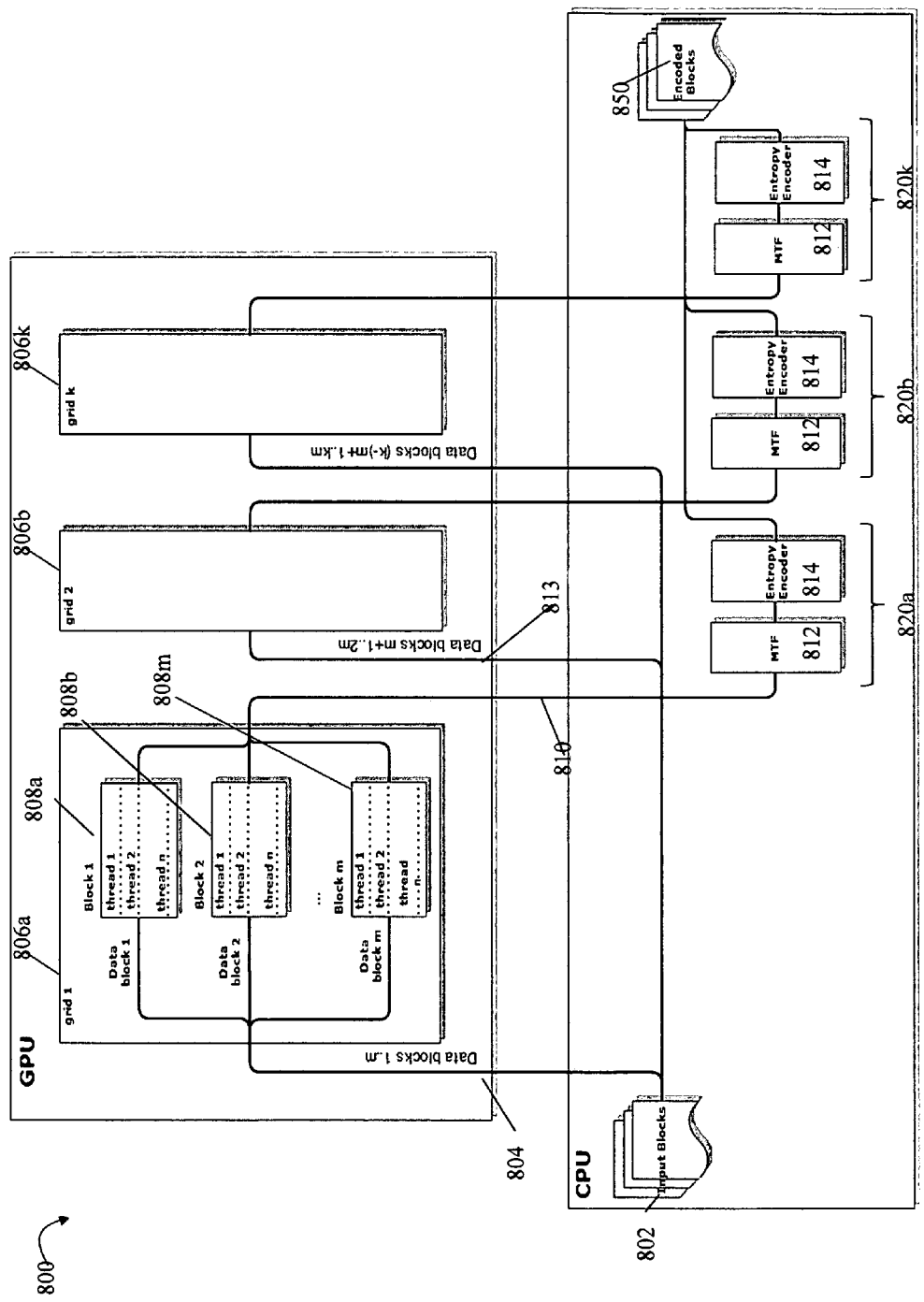

In connection with FIG. 11, the following should be noted. Each of 806a-806k may represent the same BWT sorting kernel that may be executed on the GPU at "k" different points in time. In one embodiment, the kernel may be processing that performs the sorting for any version of the original or variation of the BWT technique (e.g., performs processing of step 504 of FIG. 6). In some embodiments, each of 806a-806k may be a grid of threads. Furthermore, each of 820a-820k, respectively, represents the same set of MTF and entropy encoding instructions that may be executed on the CPU. Each of 820a-820k receives as input the output produced, respectively, by each of 806a-806k. Generally, the subsequent processing represented by 820a (performed with respect to the set "a" of m input data blocks) may be performed by the CPU at the same time the GPU is performing the BS transformation for the next (e.g."a+1") set of "m" input data blocks as represented 806b.

In the embodiment illustrated in FIG. 11, each blocks of threads 808a-808m may process one of the M data blocks as described above. Each thread block may execute on one of the MPs. Within a single thread block, each thread thereof may be executed on an SP of a single MP so that each thread in the thread block executed in parallel with other threads executing on other SPs of the single MP.

In accordance with one embodiment, the original BWT transform or technique may be used in connection with techniques herein by partitioning processing for execution on the CPU and GPU. One particular way in which this partitioning may occur in connection with compression processing is to perform the BWT transform processing on the GPU with remaining compression processing on the CPU. The embodiment may also, for example, perform all of decompression processing on the CPU (e.g., as in 310 of FIG. 4) or may perform the BWT inverse transformation processing on the GPU in a manner similar to that as described above with respect to compression processing (e.g., BWT inverse processing on GPU with remaining decompression processing of 310 performed by the CPU). It should be noted that an embodiment in accordance with techniques herein may also choose to perform one or more other portions of the compression/decompression processing in the GPU in addition to that as described herein.

Additionally, rather than just perform the original BWT technique on the GPU, an embodiment may perform a variation or modification version of the original BWT on the GPU. Described below are modified versions of the Burrows-Wheeler transform (BWT, also referred to as block-sorting compression and reversible block-sort transform) that may be used in an embodiment in accordance with techniques herein. The original BWT algorithm or technique was developed by Michael Burrows and David Wheeler such as described, for example, in Burrows M and Wheeler D (1994), *A block sorting lossless data compression algorithm*, Technical Report 124, Digital Equipment Corporation, ("original BWT technique or algorithm"), which is incorporated by reference herein, and is described above. For data compression and in a manner similar to that as described herein in connection with the original BWT technique and more generally BS transforms, the modified BWT algorithm described herein may be used in combination with one or more other techniques known to those of ordinary skill in the art to compress a string that has runs of repeated characters. As with the original BWT, the modified BWT technique described herein may not process its input sequentially, but may rather process a block of text as a single unit, also referred to herein as an input data block. The modified BWT technique also applies a reversible transformation to a block of text to form a new block that contains the same characters, but is easier to compress by simple compression algorithms. The original BWT and also the modified BWT technique perform a transformation that tends to group characters together so that the probability of finding a character close to another instance of the same character is increased substantially. Text of this kind can easily be compressed with fast locally-adaptive algorithms generally known to those of ordinary skill in the art, such as move-to-front coding in combination with Huffman or arithmetic coding.

As noted above, the modified BWT technique is a variation of the original BWT technique described herein where both may be characterized as a reversible block-sort transform that keeps the size of the input data unchanged but prepares the data for further subsequent processing.

Figure 12:
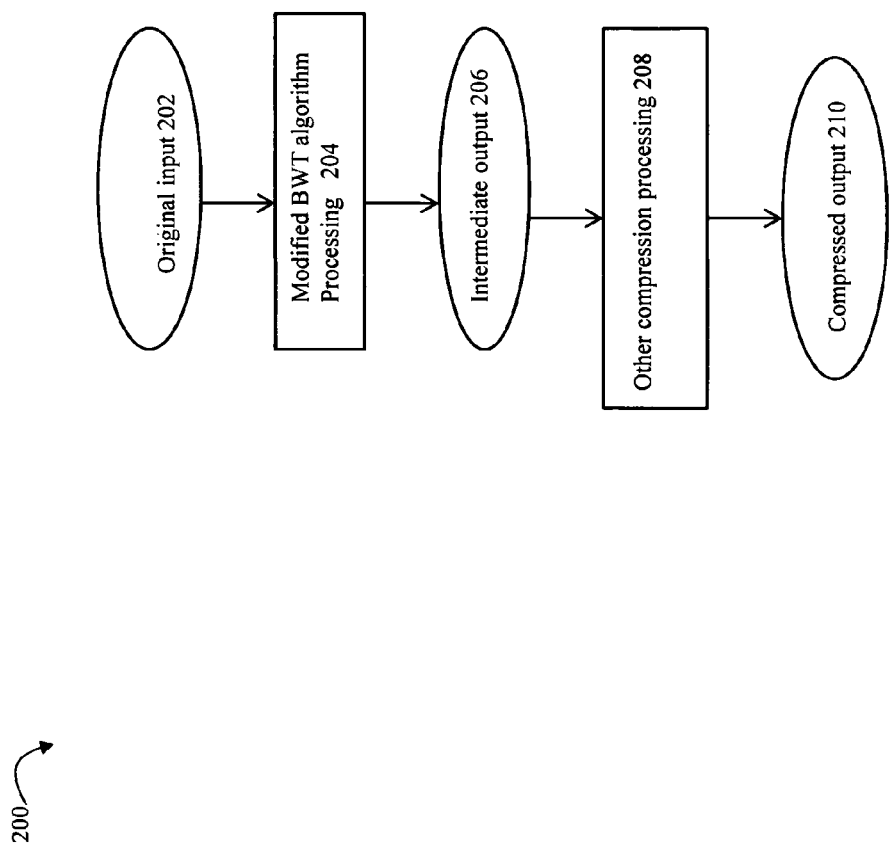

Referring to FIG. 12, shown is an example illustrating more detailed processing that may be performed in an embodiment in accordance with techniques herein for lossless compression using any of the modified BWT algorithms that will be described in more detail below. The original input data 202 is input to the modified BWT algorithm processing 204 (described in detail below) and generates an intermediate output 206. Element 204 may also be referred to as processing performed for the modified BWT compression transformation. The intermediate output 206 may then be further processed by other compression processing techniques 208. The techniques 208 may be those which compress runs of repeated data within 206 such as, for example, move-to-front transform 316 and/or entropy encoding 318 such as Huffman encoding or run-length encoding such as illustrated in connection with the original BWT technique in "A Block-sorting Lossless Data Compression Algorithm", M. Burrows and D. J. Wheeler, May 10, 1994, Technical Report 124, Digital Equipment Corporation. Processing of 208 generates compressed output 210.

Figure 13:
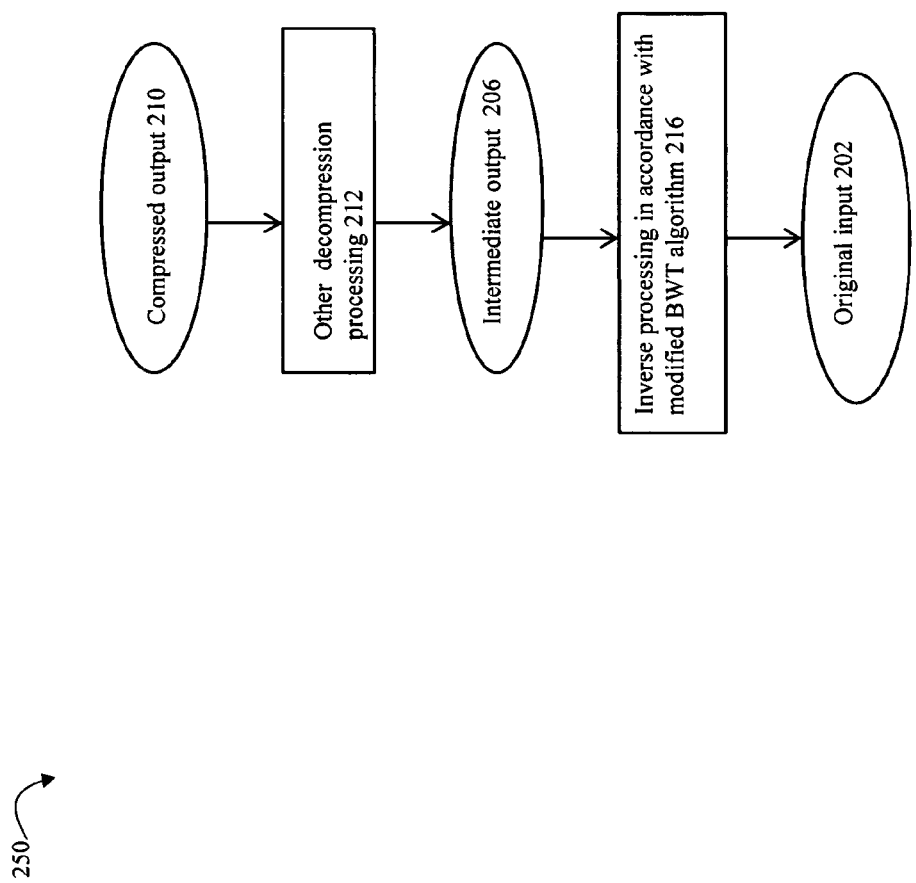

Referring to FIG. 13, shown is an example illustrating more detailed processing that may be performed in an embodiment in accordance with techniques herein for lossless decompression using any of the modified BWT algorithms described herein. The compressed output 210 is input to other decompression processing 212. Element 212 may represent complementary or inverse processing performed with respect to the particular techniques performed as part of 208 during compression. For example, if 208 includes performing the move-to-front transform which transforms the intermediate output 206 to compressed output 210, step 212 includes processing which reverses such processing of step 208. That is, step 212 includes processing the compressed output 210 to reverse the move-to-front transform (as previously applied to the intermediate output 206) in order to obtain the intermediate output 206. Step 212 may include, for example, processing of steps 324, 326 of FIG. 4. The intermediate output 206 is input to inverse or reverse processing 216 to reverse the processing performed by the modified BWT algorithm in 204 (described in detail below) and generate the original input 202. Element 216 may represent complementary or inverse processing performed with respect to the modified BWT algorithm compression processing performed as part of 204 during compression. Element 216 may also be referred to as processing performed for the modified BWT decompression transformation.

The original Burrows-Wheeler Transform (BWT) is a type of BS Transform most frequently used in various applications. As noted above, the original BWT is the reversible in that the data transform generated retains the size of the input data but permutes the order of the input characters. By "reversible" it is meant that original input data may be uniquely obtained from the BWT transform results or output data. As also noted above the original BWT collects the same characters from the substrings which are frequently occurring so that these repeated characters appear near each other in the resulting buffer. These repeated characters are then easy to compress using MTF encoding. As described above, the original BWT transform is performed by sorting (in lexicographical order) all the possible cyclic shifts of the input data. The output of original BWT transform is formed from the last characters of these sorted of cyclic shifted substrings. Although the original BWT technique may be used in an embodiment partitioning processing between the CPU and GPU as described above, the original BWT algorithm has, in the opinion of the inventor, the following problems in connection with implementing it for execution on the GPU:

1. The time performance of the parallel sorting (e.g., such as in connection with step 504 of FIG. 6) does not decrease linearly as the number of the worker threads increases.

2. Different elementary lexicographical comparisons (performed during the BWT sort) require a different number of operations to be completed and depend on the input data. This fact introduces the branches and slows down the algorithm execution.

3. The original BWT algorithm is memory intensive. The elementary comparison may use all the elements of input data buffers which, in the most cases, is bigger than the size of shared memory.

Generally, of the foregoing items, problem 1 may be unavoidable due to the nature of the sort operation, while problems #2 and #3 note above may be resolved using any of one or more modified versions of the original BWT technique. As a first modified version of the original BWT technique, the Schindler Transform (ST) of order L may be utilized. As known in the art, the Schindler Transform, such as described in M. Schindler, "A fast block-sorting algorithm for lossless data compression," in Proceedings DCC '97 Data Compression Conference, Snowbird, UT, USA, March 1997, p. 469, which is incorporated by reference herein, of order L is similar to the original BWT, but uses a limited number L of symbols during the lexicographical comparison. If the first L symbols of two cyclic rotations of the buffer are equal, these rotations will be compared by their positions in the input string. If order L of ST is equal to the size of input buffer, then ST is equal to the BWT transform. Therefore, the compression ratio which is obtained by using ST transform may be slightly lower when compared to the compression ratio of original BWT transform, but using ST allows solving problems 2 and 3 mentioned above when performing the ST on the GPU rather than the CPU. The implementation of the Schindler Transform (ST) may be executed on a GPU and may characterized as including subprocessing steps related to how to perform lexicographical comparison and sorting which may be implemented as described above. Generally, the sorting may be performed on the GPU and may use any suitable sorting technique known to those of ordinary skill in the art.

What will now be described is yet a second modified version of the original BWT technique. In this second modified version of the original BWT technique, one or more special symbols referred to herein as "stop symbols" may be used to intentionally decrease the repeatability of the input data by inserting a stop symbol at predetermined or predefined positions in the input data. Stop symbols may be characterized as one or more symbols which are unique to the input data being processed in that they are guaranteed not to be included as a symbol in the input data stream. The stop symbols may be inserted, for example, every "L" positions in the input data stream (e.g., between every pair of "L" symbols in the input data prior to performing processing such as described herein in connection with FIG. 6 for the original BWT technique. By inserting the stop symbol every L symbols in the input data stream, the maximum number of symbols what are looked up during the substring comparisons (e.g. such as in connection with step 504 of FIG. 6) is determined by the distance between the stop symbols. Decreasing the number of symbols of the input data used for substring comparison allows preloading data needed for performing such comparisons from global GPU device memory to the faster shared memory. With reference back to FIG. 9, the stop symbols may be inserted into the input data stream, for example, prior to performing step 722 when copied from the CPU to the GPU memory (e.g. prior to the copying). As another option, the stop symbols may be inserted by code that executes on the GPU after the input data is copied from the CPU to device memory of the GPU.

In connection with stop symbols used in connection with the second modified version of the original BWT technique, different cases may be considered based on variations with the stop symbols utilized. As a first case, an embodiment may be able to guarantee that the stop symbol is unique with respect to input being processed. In this case, there are a set of one or more symbols that you know will not be included in the input being processed and may therefore be used as stop symbols. The original BWT algorithm is modified to include an additional processing step where a stop symbol is inserted at predefined locations into the input string prior to sorting as noted above. Other than this additional step, there are no additional changes to the BWT algorithm.

As a second and more general case consideration, an embodiment may not be able to guarantee that the stop symbol is unique with respect to input being processed. In other words, the input stream being processed may contain any possible character or symbol so that there is no reserved set of one or more symbols to be used as stop symbols to distinguish a character as being included in the input stream from a stop symbol. In this case, the input may still be processed as outlined above in that a stop symbol is inserted in predetermined locations such as every L positions in the input stream. It should be noted that, although the stop symbol may be inserted at every L positions in the input stream, it is not possible to impose the hard limit for the maximum number of comparisons (e.g., needed to compare two substrings). When the stop symbol is not guaranteed to be unique and some symbol which may occur in the input stream is utilized as the stop symbol and inserted as described above, the average number of comparisons will decrease (in comparison to no stop symbol insertion at all as with the original BWT algorithm) and depends on the distance L between "stop symbols". In this second more general case, an embodiment may randomly select a symbol from the set of possible symbols of the input stream for use as a stop symbol.

As a third case, an alternative technique may be used as an alternative to the second case above in connection with stop symbols utilized when the stop symbol cannot be guaranteed as unique with respect to the input stream being processed. Moreover, it should be noted that it more typical of an embodiment in that it cannot be guaranteed to have one or more symbols for use as "stop symbols" that are unique with respect to the data block (e.g. stop symbols are symbols that are guaranteed not to be included in the data block). In this case additional processing may be performed as will now be described to be utilized as an alternative for the second case noted above.

Figure 14:
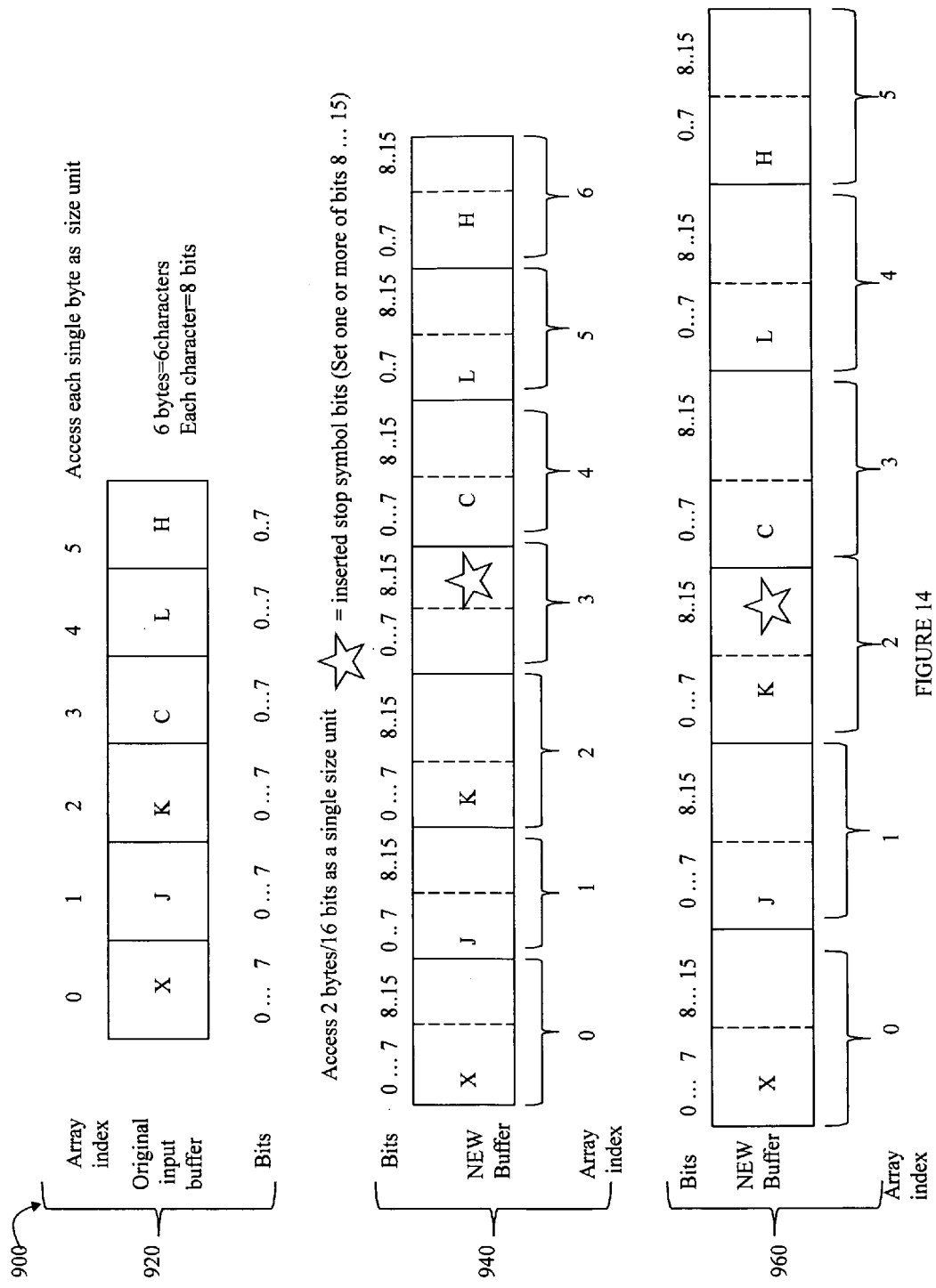
FIG. 14 is an example illustrating use of stop symbols in an embodiment in accordance with techniques herein.

Referring to FIG. 14, shown is an example 900 illustrating processing that may be performed in an embodiment in connection with stop symbols when there is no symbol guaranteed to be excluded from the input data stream for use as a stop symbol. Element 920 is a simple illustrations of an original input buffer that may represent the input stream being processed. The input buffer of 920 in this example is an array of cells or elements where each such array element is a single byte (e.g., 8 bit) characters. The example assumes a simple limited number of 6 characters in the input buffer to illustrate the technique but, more generally, the input string may contain any of the 256 possible characters for the single byte character thereby leaving no character as "unique" for use as a stop symbol.

Referring to element 940, as a first step, a NEW buffer may be allocated in which each cell or element of the array is twice the size of each cell or array element of the original input buffer of 920. NEW buffer in 940 in this example may then be defined as an array where each cell is 16 bits or 2 bytes rather than 1 byte/8 bits. More generally, whatever the unit of granularity of each cell or array element in the original input buffer 920, NEW buffer may be defined as an array (or equivalent data structure) where each cell in NEW buffer is twice the size of the cell of the original input buffer 920. Still more generally, the array or other structure used as NEW buffer may have each cell thereof with a size that is an integer multiple of N, N being a number of bytes or other size unit of each symbol in the input data. For example, N may also be expressed in terms of bits rather than bytes. For our simple example in 940, the NEW buffer has a size of 12 bytes to accommodate the contents of the original input buffer 920. Additionally, NEW buffer has added storage allocated to accommodate the additional cells for each stop symbol to be inserted as a new additional array element to NEW buffer. In the example of 940, assume that a single stop symbol is to be inserted thereby requiring NEW buffer to have a size of 14 bytes (e.g., 12 bytes for 6 array elements for the input data and an additional 2 bytes for another array element for the stop symbol being inserted). As a second step, the input data is copied from the original input buffer of 420 to the NEW buffer of 940 with the addition of a stop symbol being inserted every L symbols of the input stream. Input data when copied to the NEW buffer may be aligned on each 2 byte (e.g., NEW buffer array cell) boundary. In this example of 900, the input data may be any character or symbol able to be encoded or represented as a single byte. In other words, each symbol of the input data is able to be represented within 8 bits thereby having an equivalent decimal value encoding of less than or equal to 255. In connection with stop symbols for our example, stop symbols which will be unique for the input data may be any symbol having an equivalent decimal value encoding of more than 255 (e.g., at least one of bits 8 . . . 15 set in the second byte).

For the example illustrated in 940, assume as noted above that we want to insert a stop symbol after every the 3 symbols of the input data 920. The stop symbol may be any character in which one or more of the upper 8 bits (denoted 8-15)/second byte are set in order to distinguish from the possible bit settings for the 1 byte symbols from the input buffer which are all placed in the first byte (e.g., able to be encoded in bits 0 . . . 7 of each NEW buffer array element). In the example 940, the stop symbol bit settings of the second byte are represented as a star. Note that each symbol of the input buffer 920 is aligned in NEW buffer of 940 on a 2 byte boundary and additionally, the stop symbol is inserted as a NEW additional symbol in a 2 byte cell of 940 (e.g., the array element denoted by the index 3 having one or more of bits 8-15 set. For the stop symbol in NEW buffer[3], the remaining 8 bits of the first byte (e.g., denoted bits 0 . . . 7 of NEW buffer[3]) may have any combination of possible bit settings). Once the input data has been copied into NEW buffer with the additionally inserted stop symbols, processing may continue as described above with the BWT algorithm steps.

As a further variation to NEW buffer usage in element 940, reference is now made to element 960. Element 960 includes a NEW buffer as described in connection with 940 with the difference that the size of NEW buffer is twice the size of the input buffer 920 with no additional storage allocated for stop symbols. In 960, each array element is 2 bytes and each symbol of the input data is copied and aligned to begin in a new array element or cell. In 960, note that the stop symbol is still inserted after the 3$^{rd}$ symbol of the input stream but the stop symbol is inserted in the second byte/bit positions 8-15. In other words, the STOP symbol is "inserted" by overlaying it in NEW buffer[2] in the second byte. Rather than allocate an additional array element for each stop symbol, the stop symbol is designated as being some non-zero bit representation in the second byte of an array element separating each L input data symbols. (e.g., in a zero-based NEW buffer array, this is the second byte of array element L-1, 2L-1, 3L-1, etc.). In connection with the foregoing, the stop symbol may have a decimal encoding of more than 255 with the second byte/bits 8 . . . 15 being any non-zero bit setting (e.g., having at least one of bits 8 . . . 15 set to 1). The first byte of the stop symbol may have bits 0 . . . 7 all being zeros or other values. In this case for 960, the foregoing stop symbol may be logically ORed with the symbol in NEW buffer [2] thereby creating NEW buffer [2] as an array element including one byte of input data in combination with a second byte bit settings for the stop symbol.

The first byte of the stop symbol which is non-zero may be ignored in connection with foregoing logical ORing in order to preserve the actual input data symbol stored in the first byte/bits 0 . . . 7 of NEW buffer[2]. Thus, the example 960 illustrates a technique using stop symbols providing for an encoding in a single array element, NEW buffer[2], of both the stop symbol in combination with a symbol from the input data.

It should be noted that the technique illustrated in connection with 940 in contrast with 960, provides for more unique stop symbols (e.g . . . , 65536−256=65280 unique stop symbols possible with 940 compared to 255 possible different stop symbols for 960). Thus, an embodiment may prefer to utilize the technique for stop symbols illustrated in connection with 940 rather than 960 when such additional stop symbols are desired. In contrast, the technique of 960 may be preferred over 940 if it is not desirable to allocate the additional memory for the stop symbols.

When using any of the foregoing techniques in which stop symbols are inserted, the stop symbols may be extracted as part of decompression processing after running the corresponding version for the inverse BWT. When the stop symbols are inserted as new additional symbols into the input data stream at predefined L intervals (e.g., separating every L symbols in the input data stream), the location of each stop symbol in the decompressed output is known and may therefore be removed. When the stop symbols are inserted as in connection with element 960, the location of each stop symbol in the decompressed output is also known (e.g. as occupying the second or last byte of every Lth array element of NEW buffer) and may be automatically ignored when extracting the input data since the second byte of each array element is known not to contain any information about the original input data.

In connection with the techniques described herein for stop symbol insertion, such techniques may be used in a version of the BWT technique described herein that is implemented on the GPU in combination with the CPU. However, it should be noted that an embodiment in accordance techniques herein for stop symbol insertion as may be used in a version of the BWT technique may also be implemented on the CPU alone without use of the GPU.

Figure 15:
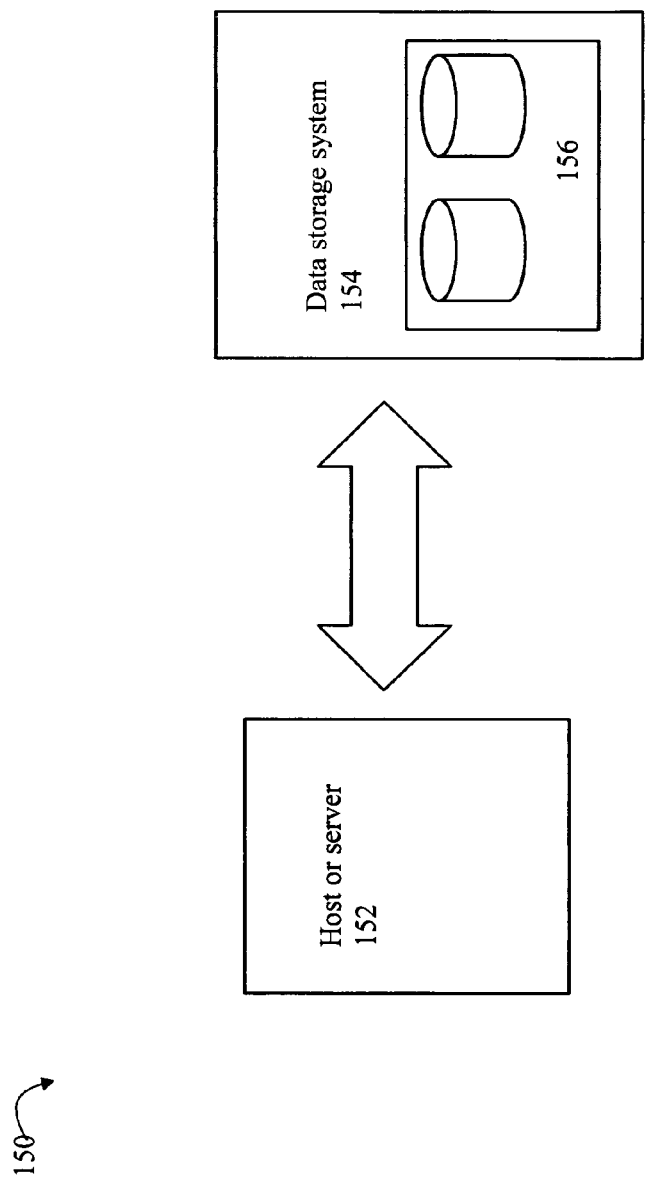
FIG. 15 is an example illustrating use of techniques herein in connection with an embodiment including a host or server and data storage system.

It should be noted that the techniques described herein such as may be used with lossless data compression/decompression have a wide variety of applications. Some exemplary embodiments in connection with a computer system are described above. As another example, reference is made to example 150 of FIG. 15 where the lossless data compression/decompression techniques described herein may be performed in connection with data storage and backup systems. Data which is backed up, such as from a host or server 152 to one or more storage devices 156 of a local and/or remote data storage system 154 may utilize the techniques herein to store the backed up data on the storage system in a compressed form. Accordingly, any necessary decompression of the backed up data may be performed such as in connection with performing a data restoration operation of the requested backed up data to restore the originally backed up data set from the data storage system 154 to the host or server 152. The processing for the data compression and/or decompression may be performed by the host 152 and/or data storage system 154. For example, in one embodiment in accordance with techniques herein, the processing for the data compression and decompression may be performed entirely by the data storage system 154. As a variation to the foregoing, the processing for the data compression and decompression may be performed entirely by the host or server 152. As a further variation, the processing for the data compression and decompression may be partitioned between the host or server 152 and the data storage system 154 in any one or more ways as understood by those of ordinary skill in the art.

Additionally, an embodiment in accordance with techniques herein using any of the modified BWT algorithms described herein, the original BWT algorithm, or other block sorting technique, may be performed using a GPU or graphics processing unit. Such an embodiment in accordance with techniques herein uses the GPU for non-graphics related computation, which is data compression and/or decompression as described herein. Such an embodiment may utilize one or more GPUs, such as may be included in an additional computation device, such as a PCI-X card, and work in combination with one or more CPUs. The model for GPU computing may be characterized as use of a CPU and GPU together in a heterogeneous co-processing computing model. The sequential part of the application may run on the CPU and the computationally-intensive part is accelerated by the GPU such by performing portions of the application in parallel using the numerous cores of the GPUs. Use the GPUs, which traditionally handles computation only for computer graphics, to more generally perform processing in applications traditionally handled by the CPU, such as to perform processing in connection with data compression and/or decompression as described herein, may also be referred to as general-purpose computing on graphics processing units or GPGPU. An embodiment in accordance with techniques herein may use GPUs in components by NVIDIA, such as GPUs in the TESLA series based on NVIDIA's massively parallel CUDA architecture, to perform processing of the lossless compression/decompression techniques described herein. As known in the art, the CUDA architecture consists of hundreds of processor cores that operate together to process application data. An application having code executed by GPUs in accordance with the CUDA architecture may include code that performs parallel processing. An application developer may modify an application including code which performs steps sequentially to perform appropriate portions in parallel on the GPUs with remaining portions of the application being executed by the CPU. Mapping a function to the GPU may include rewriting the function to expose the parallelism in the function and adding code to move data to and from the GPU. The developer is tasked with launching many threads simultaneously and the GPU hardware manages the threads and does thread scheduling.

An embodiment may implement the techniques herein using code executed by a processor. For example, an embodiment may implement the techniques herein using code which is executed by a CPU and GPU of a computer system or any other system including a main CPU and one or more GPUs. As will be appreciated by those skilled in the art, the code may be stored on such systems on a computer-readable storage medium having any one of a variety of different forms including volatile and nonvolatile, removable and non-removable media implemented in any method or technology for storage of information such as computer readable instructions, data structures, program modules or other data. Computer-readable storage media includes, but is not limited to, RAM, ROM, EEPROM, flash memory or other memory technology, CD-ROM, (DVD) or other optical storage, magnetic cassettes, magnetic tape, magnetic disk storage or other magnetic storage devices, or any other medium which can be used to store the desired information and which can accessed by a processor.

While the invention has been disclosed in connection with preferred embodiments shown and described in detail, their modifications and improvements thereon will become readily apparent to those skilled in the art. Accordingly, the spirit and scope of the present invention should be limited only by the following claims.

What is claimed is:

1. A method for performing data compression comprising:
receiving input data;
inserting a plurality of stop symbols at predetermined positions between portions of said input data, wherein said plurality of stop symbols are symbols newly added to the input data thereby not replacing any existing symbols of the input data, wherein one of said plurality of stop symbols is inserted between every L symbols of the input data, wherein said input data includes a plurality of symbols each represented using a maximum of X bits and having a maximum encoded value V, X being a non-zero integer value and wherein each of said plurality of stop symbols is represented using a bit pattern of more than X bits thereby having an encoded value greater than V;
performing a block sorting transform on said input data generating a first intermediate output wherein said block sorting transform is performed by executing code on a graphic processing unit that processes portions of said input data in parallel, wherein said block sorting transform includes performing substring comparisons and wherein inserting one of the plurality of stop symbols between every L symbols in the input data thereby specifies that each substring, compared in each of said substring comparisons, includes a maximum number of L symbols; and
performing subsequent processing of said first intermediate output to generate compressed data.

2. The method of claim 1, wherein said subsequent processing includes performing a move to front transform using said first intermediate output and generating a second intermediate output.

3. The method of claim 2, wherein said second intermediate output is input to entropy encoding which generates said compressed data.

4. The method of claim 1, wherein said block sorting transform is a version of a Burrows-Wheeler transform.

5. The method of claim 4, wherein said inserting a plurality of stop symbols is performed prior to performing said block sorting transform.

6. The method of claim 5, wherein each of said plurality of stop symbols is unique with respect to symbols of the input data, each of said plurality of stop symbols being a symbol that is not included in said input data.

7. The method of claim 6, wherein a first portion of said input data is processed including M symbols, each symbol in said input data being represented using N storage units, N being a value of at least 1, and the method further comprises:
allocating an amount of storage for a structure, said structure having M cells for storing said first portion and J cells for storing stop symbols, each cell of said structure having a size of more than N storage units; and
copying said first portion of said input data into said structure while inserting one of said plurality of stop symbols between each predetermined number of symbols of said first portion, each symbol from said first portion and each of said inserted stop symbols being aligned on a boundary of a different cell of said structure.

8. The method of claim 7, wherein said structure is an array, N represents a number of bytes, and each cell in said array has a size=2*N.

9. The method of claim 7, wherein said structure is an array, N represents a number of bytes, and each cell in said array has a size that is an integer multiple of N.

10. The method of claim 6, wherein a first portion of said input data is processed including M symbols, each symbol in said input data being represented using N storage units, N being a value of at least 1, and the method further comprises:
allocating an amount of storage for a structure, said structure having M cells for storing said first portion, each cell of said structure having a size of P storage units, wherein P is an integer value that is greater than N; and
copying said first portion of said input data into said structure while inserting one of said plurality of stop symbols between each predetermined number of symbols of said first portion, each symbol from said first portion being aligned on a boundary of a different cell of said structure, each of said plurality of stop symbols inserted having a value encoded in a first of said P storage units of one of said cells of said structure, wherein said first storage unit of said one cell is not used to represent a symbol of said input data.

11. The method of claim 4 further comprising:
performing decompression processing to obtain said input data from said compressed data, said decompression processing including performing an inverse transform that is an inverse of said block sorting transform performed in connection with previously compressing said input data to obtain said compressed data.

12. The method of claim 3, wherein said block sorting transform and said move to front transform are reversible transforms.

13. A method for processing input data comprising:
receiving, using a processor, the input data;
generating, using a processor, a compressed representation of the input data, said generating including performing first processing, said first processing including:
using a transformation technique to transform the input data into first transformed data, wherein, prior to performing said transformation technique, said first processing includes generating an input stream including said input data and a plurality of stop symbols, wherein one of the plurality of stop symbols is inserted between each set of L symbols in said input data, L being a non-zero integer, wherein said plurality of stop symbols are symbols newly added to the input data thereby not replacing any existing symbols of the input data, wherein said transformation technique is a block sorting technique that includes performing substring comparisons and wherein inserting one of the plurality of stop symbols between every L symbols in the input data thereby specifies that each substring, compared in each of said substring comparisons, includes a maximum number of L symbols, wherein said input data includes a plurality of symbols each represented using a maximum of X bits whereby the X bits represent a set of encoded values, X being a non-zero integer value and wherein each of the plurality of stop symbols is represented using a bit pattern of more than X bits and has an encoded value not included in the set of encoded values.

14. The method of claim 13, wherein said transformation technique is performed by executing instructions in parallel on a graphics processing unit of a computer.

15. The method of claim 14, wherein said first processing includes serially executing instructions on a central processing unit of a computer to perform a move to front transform and entropy encoding.

16. A non-transitory computer readable medium comprising code stored thereon for processing input data, the non-transitory computer readable medium comprising code that, when executed by a processor, performs a method comprising:
receiving the input data;
generating a compressed representation of the input data, said generating including performing first processing, said first processing including:
using a block sorting transformation technique to transform the input data into first transformed data, wherein, prior to performing said block sorting transformation technique, said first processing includes generating an input stream including said input data and a plurality of stop symbols, wherein one of the plurality of stop symbols is inserted between each set of L symbols in said input data, L being a non-zero integer, wherein said plurality of stop symbols are symbols newly added to the input data thereby not replacing an existing symbol of the input data, wherein said block sorting transformation technique includes performing substring comparisons, and wherein inserting one of the plurality of stop symbols between every L symbols in the input data thereby specifies that each substring, compared in each of said substring comparisons, includes a maximum number of L symbols, wherein said input data includes a plurality of symbols each represented using a maximum of X bits whereby the X bits represent a set of encoded values, X being a non-zero integer value and wherein each of the plurality of stop symbols is represented using a bit pattern of more than X bits and has an encoded value not included in the set of encoded values.

17. The non-transitory computer readable medium of claim 16, wherein said block sorting transformation technique is performed by executing instructions in parallel on a graphics processing unit of a computer.

18. The non-transitory computer readable medium of claim 17, where the computer readable medium further comprises code that, when executed performs processing comprising:
partitioning the input data into a plurality of partitions, each of said partitions including M input data blocks;
performing second processing for each of said partitions, said second processing including:
copying said input data from first memory used by a central processing unit of a computer system to second memory of a device of the computer system, said device including a graphics processing unit that uses the second memory;
inserting one of the plurality of stop symbols between each set of L symbols in said each partition of input data; and
performing said block sorting transformation technique on each of said M input data blocks in said each partition in parallel by executing M blocks of threads in parallel, each of said M blocks of threads processing one of said M input data blocks, said M blocks of threads being including in a grid of threads executed on said graphics processing unit.

* * * * *